United States Patent
Mayer et al.

(10) Patent No.: US 6,946,065 B1
(45) Date of Patent: Sep. 20, 2005

(54) PROCESS FOR ELECTROPLATING METAL INTO MICROSCOPIC RECESSED FEATURES

(75) Inventors: Steven T. Mayer, Portland, OR (US); Vijay Bhaskaran, Beaverton, OR (US); Evan E. Patton, Portland, OR (US); Robert L. Jackson, Lake Oswego, OR (US); Jonathan Reid, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 319 days.

(21) Appl. No.: 09/716,016

(22) Filed: Nov. 16, 2000

Related U.S. Application Data

(62) Division of application No. 09/410,710, filed on Sep. 30, 1999, now abandoned.
(60) Provisional application No. 60/105,699, filed on Oct. 26, 1998.

(51) Int. Cl.$^7$ .......................... C25D 5/18; H01L 21/768
(52) U.S. Cl. ...................... 205/102; 205/103; 205/104; 205/118; 205/123; 205/149; 205/157; 205/186; 205/187
(58) Field of Search ................................. 205/102, 103, 205/104, 107, 108, 118, 123, 149, 157, 186, 187, 219, 296, 297, 298; 435/625, 627

(56) References Cited

U.S. PATENT DOCUMENTS

| | | | |
|---|---|---|---|
| 4,092,226 A | | 5/1978 | Laing et al. ................... 204/51 |
| 4,272,335 A | * | 6/1981 | Combs ..................... 204/52 R |
| 4,461,680 A | * | 7/1984 | Lashmore ..................... 204/41 |
| 4,563,399 A | * | 1/1986 | Wright ........................ 428/626 |
| 5,618,634 A | | 4/1997 | Hosoda et al. .............. 428/610 |
| 5,935,762 A | | 8/1999 | Dai et al. .................... 430/312 |
| 5,936,707 A | | 8/1999 | Nguyen et al. ............... 355/18 |
| 5,939,788 A | | 8/1999 | McTeer ...................... 257/751 |
| 5,969,422 A | * | 10/1999 | Ting et al. .................. 257/762 |
| 5,972,192 A | | 10/1999 | Dubin et al. ................ 205/101 |
| 6,074,544 A | * | 6/2000 | Reid et al. ................... 205/157 |
| 6,099,711 A | | 8/2000 | Dahms et al. .............. 205/101 |
| 6,113,771 A | * | 9/2000 | Landau et al. .............. 205/123 |
| 6,132,584 A | * | 10/2000 | Hubel ........................ 205/103 |
| 6,197,181 B1 | * | 3/2001 | Chen ......................... 205/123 |

OTHER PUBLICATIONS

Arthur Rose et al, The Condensed Chemical Dictionary, seventh edition, Reinhold Book Corporation, New York, 1968, pp908.*

(Continued)

*Primary Examiner*—Roy King
*Assistant Examiner*—William T. Leader
(74) *Attorney, Agent, or Firm*—Beyer, Weaver & Thomas, LLP.

(57) ABSTRACT

Several techniques are described for reducing or mitigating the formation of seams and/or voids in electroplating the interior regions of microscopic recessed features. Cathodic polarization is used to mitigate the deleterious effects of introducing a substrate plated with a seed layer into an electroplating solution. Also described are diffusion-controlled electroplating techniques to provide for bottom-up filling of trenches and vias, avoiding thereby sidewalls growing together to create seams/voids. A preliminary plating step is also described that plates a thin film of conductor on the interior surfaces of features leading to adequate electrical conductivity to the feature bottom, facilitating bottom-up filling.

14 Claims, 46 Drawing Sheets

OTHER PUBLICATIONS

*ULSI Technology*, Eds, C.Y. Chang and S.M. Sze (McGraw–Hill, 1996, pp. 444–445).

*Electroplating*, Frederick A. Lowenheim, , (McGraw–Hill, 1978, p 423).

*Selective and Blanket Electroless Cu Plating Initiated by Contact Displacement . . .*, Valery M. Dubin, Yosi Shacham–Diamand and Bin Zhao, P.K. Vasudev, Chiu H. Ting, (VMIC Conf. Jun. 26 & 27, 1995, pp 314–321).

*Copper Electroplating Process for Sub–Half–Micron ULSI Structures*, Robert J. Contolini, Lisa Tarte, Robert T. Graff, Lee B. Evans, J. Neal Cox, Marc R. Puich, Justin E. Gee, Xiao–Chun Mu, Chien Chiang, (VMIC Conf. Jun. 27–29, 1995, pp. 322–325).

* cited by examiner

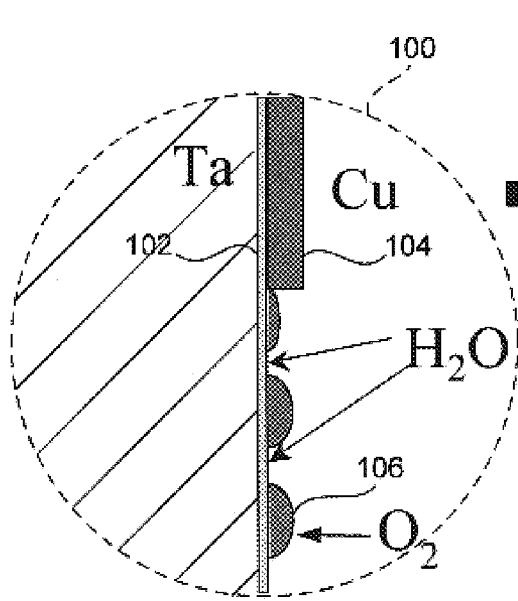 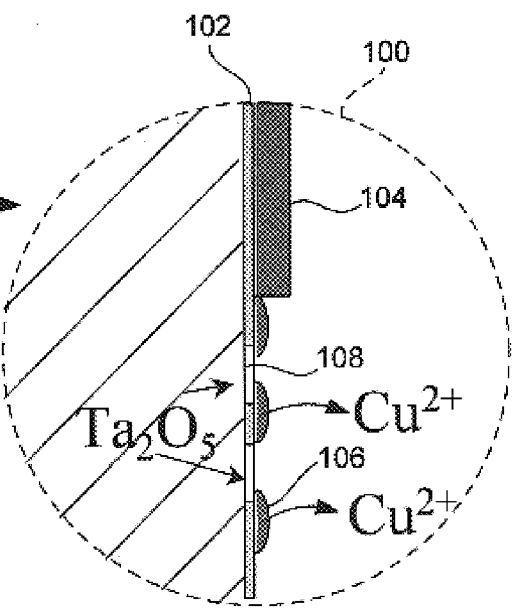
FIG. 5A  FIG. 5B
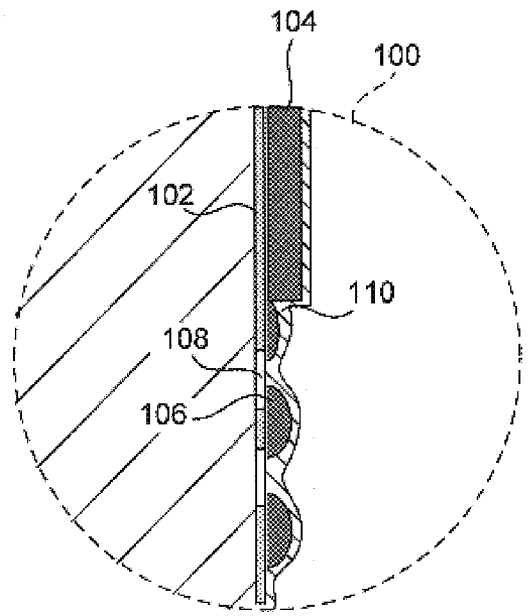
FIG. 6

How Much Additive Comes in With the Solution?

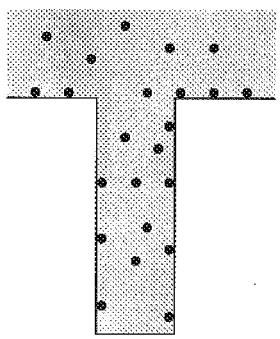

Ratio: Surface to Solution Molecules

| Aspect Ratio | | | | |
|---|---|---|---|---|
| 2 | 299 | 60 | 155 | 52 |
| 2.5 | 365 | 73 | 190 | 63 |
| 3 | 432 | 86 | 224 | 75 |
| 3.5 | 498 | 100 | 259 | 86 |
| 4 | 565 | 113 | 293 | 98 |
| 4.5 | 631 | 126 | 327 | 109 |
| 5 | 697 | 139 | 362 | 121 |
| 5.5 | 764 | 153 | 396 | 132 |

| Conditions | | | | |
|---|---|---|---|---|
| ppm | 20 | 100 | 100 | 300 |
| MW | 100 | 100 | 3000 | 3000 |
| Moles/um^3 | 2.0E-19 | 1.0E-18 | 3.3E-20 | 1E-19 |
| Molec/um^3 | 120460 | 602300 | 20077 | 60230 |
| Molecules size (nm) | 0.5 | 0.5 | 1.7 | 1.7 |
| Molec/um^2 | 4000000 | 4000000 | 346021 | 346020.8 |

<u>Conclusion:</u> At all expected additive condition, there is insufficient material stored in the inital solution within the via to lead to substantial surface absorption in the via.
-There will be an absorption time delay.

*FIG. 15*

Time Estimate for Plating Additives Absorption

Assumptions

1. Initial surface coverage is zero
2. Final surface coverage is $1 \times 10^{15}$ molecules/$cm^2$ (1 monolayer).
3. Very fast absorption kinetics (diffusion controlled)
4. No side wall absorption

Conclusions

1. Diffusion controled absorption inside of trench take a few seconds.
2. Larger surface area of trench will increase this time from this estmate.
3. High additive level will decrease time estimate

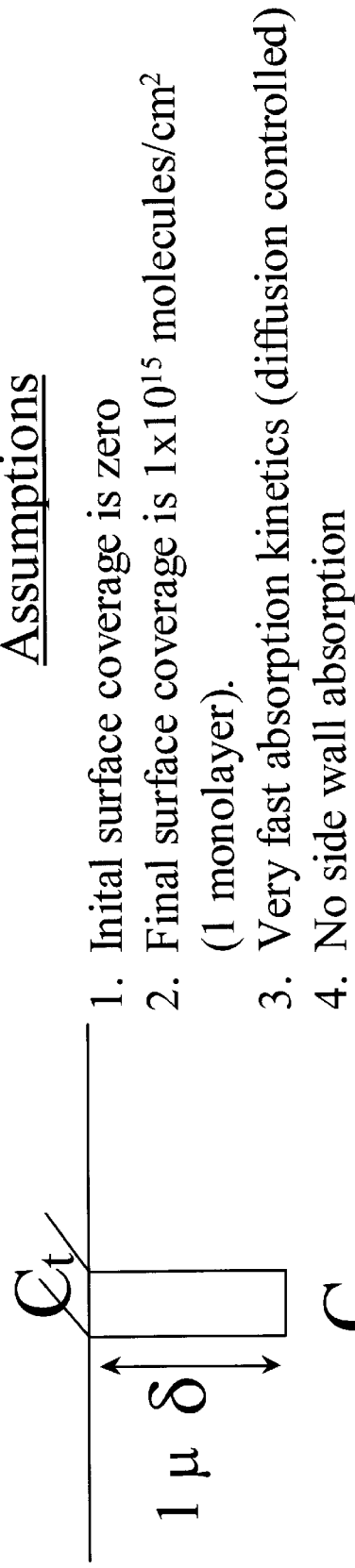

$\Delta C = 10\,ppm = 5.5 \times 10^{-8}\ M/cm^3$ $\delta = 1\mu = 1.0 \times 10^{-4}\ cm$ $D = 1.0 \times 10^{-6}\ cm^2/sec$ $F = \dfrac{D \Delta C}{\delta} = 5 \times 10^{-10}\ M/\sec cm^2 = 3.4 \times 10^{14}\ molecules/\sec cm^2$ $t_{abs} = 1 \times 10^{-15}\ molecules/cm^2 / 3.4 \times 10^{14}\ molecules/\sec cm^2 = 2.9\ \sec$

FIG. 16

Time Estimate for Absorption of Plating Additives

Assumptions

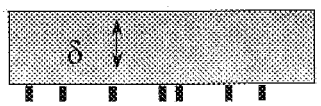

1. Inital surface coverage is zero everywhere
2. Final surface coverage is $1 \times 10^{15}$ molecules/cm² (1 monolayer).
3. Very fast absorption kinetics (diffusion controlled)
4. Concentraton at edge of boundary layer is bulk $$\Delta C = 10\, ppm = 5.5 \times 10^{-8}\ M/cm^3$$
$$\delta = 5.7\mu = 5.7 \times 10^{-4}\ cm$$
$$D = 1.0 \times 10^{-6}\ cm^2/sec$$

Conclusions

Diffusion of very low concentration plating additives may take several seconds to occur $$F = \frac{D\Delta C}{\delta} = 1 \times 10^{-10}\ M/sec\, cm^2 = 0.7 \times 10^{14}\, molecules/sec\, cm^2$$

$$t_{abs} = 1 \times 10^{15}\, molecules/cm^2 / 0.7 \times 10^{14}\, molecules/sec\, cm^2 = 14\, sec$$

FIG. 17

How Would Ta$_2$O$_5$ be Formed in the Side Walls?

| | | |
|---|---|---|
| 2Ta + 5H$_2$O | Ta$_2$O$_5$ + 10H$^+$ + 10 e$^-$ | E$_o$ = -0.75V |
| 10 H$^+$ + 10 e$^-$ | 5H$_2$ | E$_o$ = 0.00 V |
| 2Ta + 5H$_2$O | Ta$_2$O$_5$ + 5H$_2$ | ΔE = 0.75V |

Conclusions: Formation of Ta$_2$O$_5$ is anticipated (thermodynamics)'

Question: How much of the Ta is expected to be converted to the electrically insulating oxide?

Equivalent Circuit Model of Via/Trench Filling

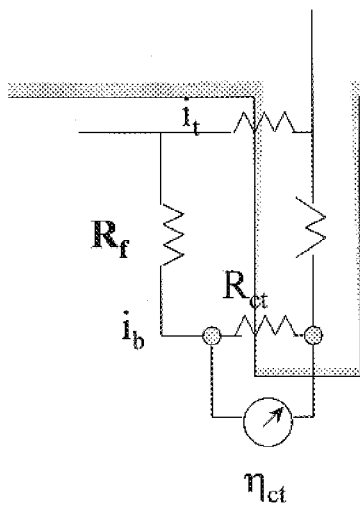

$$i = i_o[e^{-\alpha n f \eta_{ct}} - e^{(1-\alpha) n f \eta_{ct}}]$$

<u>High Current</u>     <u>Low Current</u>

$$R_{ct} = \frac{\eta_{ct}}{i} \approx \frac{\eta_{ct}}{i_o e^{-\alpha n f \eta_{ct}}} \quad R_{ct} = \frac{\eta_{ct}}{i} \approx \frac{1}{i_o n F}$$

1. The surface resistance *increases* with decreasing current!
2. W (diffusion resistance) increases with increasing current
3. $R_f$ is independant of current When is $R_f$ significant?

FIG. 19

Electrical Resistances and Filling of Small Features

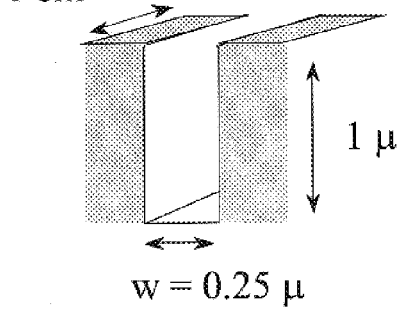

w = 0.25 μ

$R = \dfrac{\rho L}{2A} = 4\,m\Omega, 50\,k\Omega$ $\Delta V = IR = (iw)R$ $\Delta V_{Ta} = 1 \times 10^{-9}$ to $5 \times 10^{-6}$ V $\Delta V_{Ta2O5} = 0.003$ to $0.16$ V

Assumptions

1. Only Ta or $TaO_2$ (2 nm thick) is present on side wall for electrical conductivity
2. Plating occurs only at bottom of trench at 10-500 mA/cm² (conformal vs fast bottom-up fill rates).

$\rho_{Ta} = 16 \times 10^{-6}\,\Omega\,cm$, $\rho_{Ta2O5} = 50\,\Omega\,cm$

Conclusions

1. If sidewall metallic Ta of 2 nm is present in the feature, electrical resistivity is insignificant.
2. If sidewall material is cracked, exposed to oxygen and converted to $TaO_2$, the electrical resistance in the film will be to large to support bottom-up filling.

FIG. 20

Nucleation Phenomena
$$\Delta G_t = \pi r^2 (2\sigma_{13} + \sigma_{12} - \sigma_{23}) + \frac{2}{3}\pi r^3 \Delta G_v$$
$$\frac{\Delta G_t}{v_m} = \frac{3(2\sigma_{13} + \sigma_{12} - \sigma_{23})}{2v_m r} + \Delta \overline{G}_v$$
$$E(r) = \frac{RT}{nF} \ln\left[\frac{3(2\sigma_{13} + \sigma_{12} - \sigma_{23})}{2v_m r} + \Delta G_v\right]$$
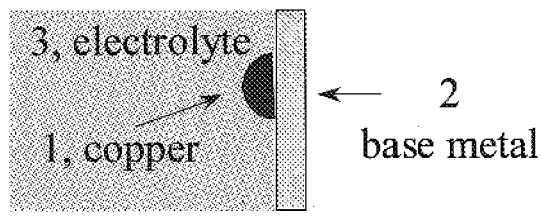
← 2 base metal
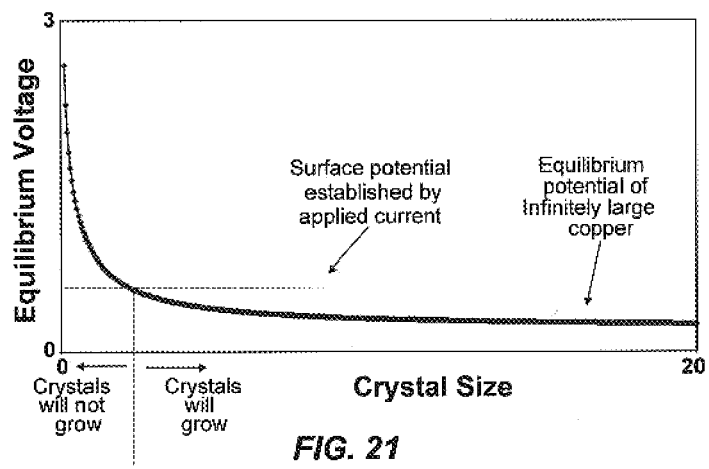
*FIG. 21*

Bipolar pulse plating: Phase 1-waveform screening
- Select tests done on SEMATECH backfilled vias (Apr 98, 3)
- Bipolar pulse with hi anodic current showed improvement over POR
- Eliminated other pulse waveforms
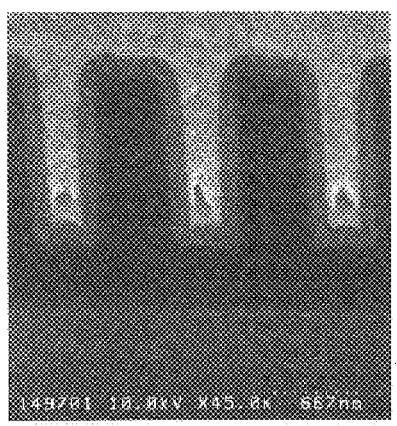
POR 1.0, 7A DC
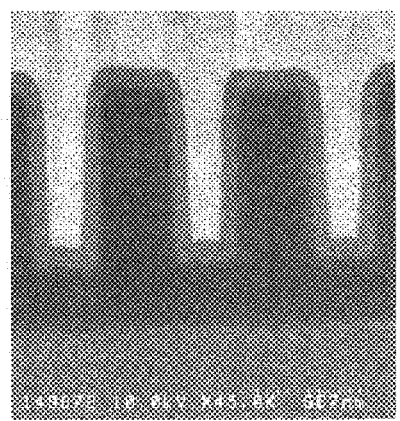
10A Cathodic, 80 A Anodic,
125 Hz, 10 msec $t_{off}$
FIG. 23

Bipolar pulse plating: Phase2-Trench optimization

◆ 1"x1" SEMATECH backfilled trenches with HCM-α seed taped on 8" wafers (52)

◆ 2 types of waveforms tested

◆ No pulsed waveform resulted in better fill than POR 1.0

◆ Higher pulsed anodic currents improved top filling

◆ Lower pulsed cathodic current improved filling
   – longer on-times were better ◆ Need to perform tests with initiation on vias

*FIG. 24*

Fill Improvement: Reverse pulse matrix
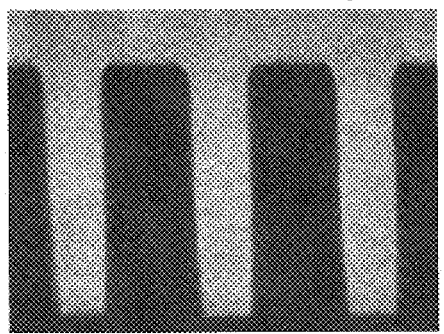 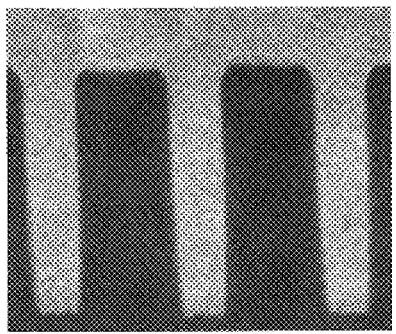
A    Field 5, 0.34 μm, AR = 4.5    B
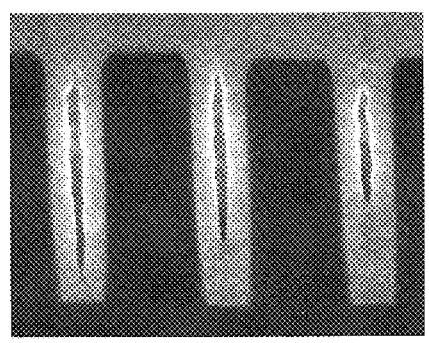
Control, 7A DC
| Pulse Matrix | | | | |
|---|---|---|---|---|
| # | Ic | $t_c/t_a$ ratio | Freq (Hz) | Toff |
| A | 4 | 25 | 10 | *0* |
| B | 4 | 25 | 10 | *3* |
- *Feature*: SEMATECH Standard vias
- *Seed*: 1600Å HCM Cu/250Å HCM Ta
- *Plate*: Step 1: 0.25A DC, 50 sec
  Step 2: Pulse
*FIG. 25*

Fill Improvement: Reverse pulse matrix
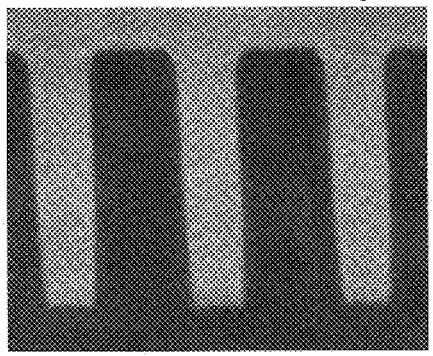
A
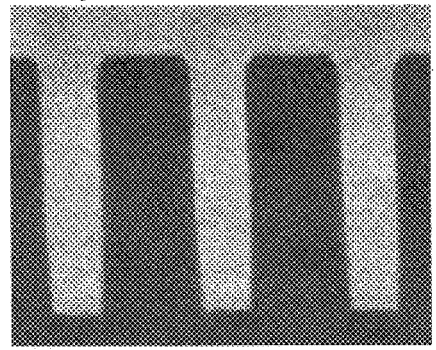
B
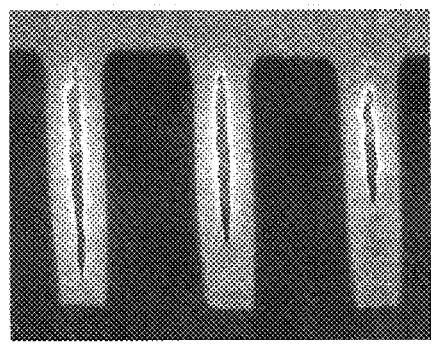
Control, 7A DC
| Pulse Matrix | | | | |
|---|---|---|---|---|
| # | Ic | $t_c/t_a$ ratio | Freq (Hz) | Toff |
| A | 4 | 24 | 100 | *0* |
| B | 4 | 22 | 100 | *3* |
- *Feature*: SEMATECH Standard vias, Field 5, 0.34 μm, AR = 4.5
- *Seed*: 1600Å HCM Cu/250Å HCM Ta
- *Plate*: Step 1: 0.25A DC, 50 sec
  Step 2: Pulse
*FIG. 26*

Reverse pulse matrix: Impact of $t_c/t_a$ ratio/freq.

A
B
C
D  *FIG. 28*

- *Feature*: SEMATECH Standard vias, Field 5, 0.34 μm, AR = 4.5
- *Seed*: 1600Å HCM Cu/250Å HCM Ta
- *Plate*: Step 1: 0.25A DC, 50 sec
  Step 2: Pulse

| Pulse Matrix | | | | |
|---|---|---|---|---|
| # | Ic | $t_c/t_a$ ratio | Freq (Hz) | Toff |
| A | 4 | 25 | 10 | 3 |
| B | 4 | 25 | 100 | 3 |
| C | 4 | 49 | 10 | 3 |
| D | 4 | 49 | 100 | 3 |

Reverse pulse matrix: Impact of $t_c/t_a$ ratio
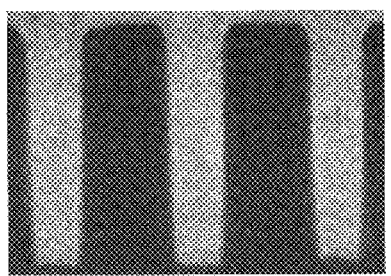
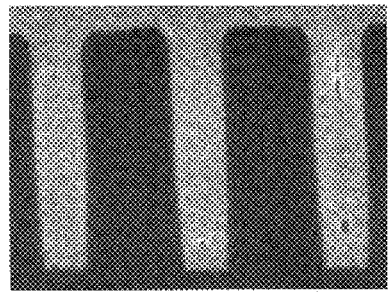
A
B
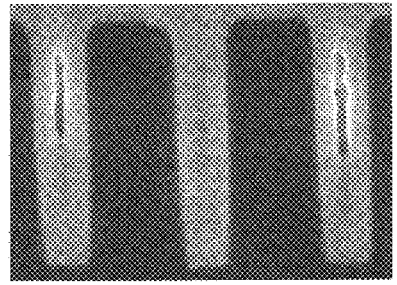
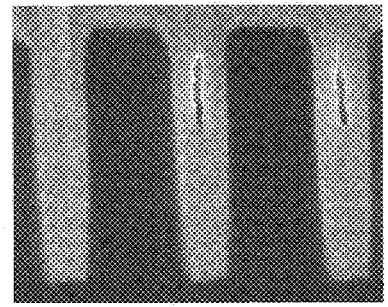
C
FIG. 29
D
- *Feature*: SEMATECH Standard vias, Field 5, 0.34 µm, AR = 4.5
- *Seed*: 1600Å HCM Cu/250Å HCM Ta
- *Plate*: Step 1: 0.25A DC, 50 sec
  Step 2: Pulse
| Pulse Matrix | | | | |
|---|---|---|---|---|
| # | Ic | $t_c/t_a$ ratio | Freq (Hz) | Toff |
| C | 8 | 25 | 10 | *0* |
| D | 8 | 25 | 10 | *3* |
| C | 8 | 49 | 10 | *0* |
| D | 8 | *50* | 10 | *3* |

Reverse pulse matrix: Impact of cathodic current/freq.
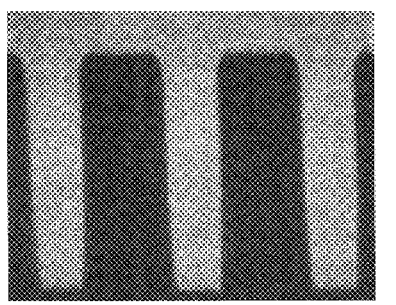
A
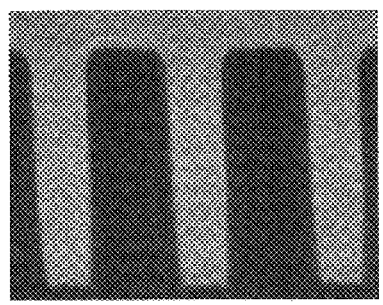
B
- *Feature*: SEMATECH Standard vias, Field 5, 0.34 μm, AR = 4.5
- *Seed*: 1600Å HCM Cu/250Å HCM Ta
- *Plate*: Step 1: 0.25A DC, 50 sec
  Step 2: Pulse
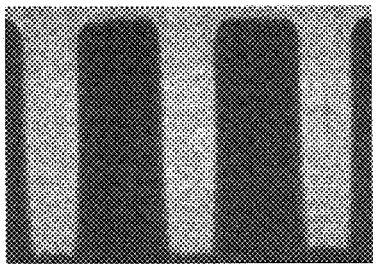
C
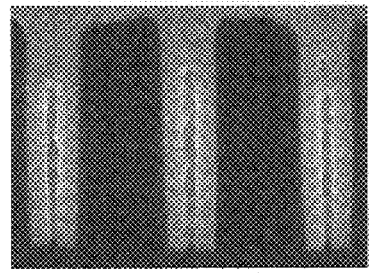
FIG. 30  D
| Pulse Matrix | | | | |
|---|---|---|---|---|
| # | Ic | $t_c/t_a$ ratio | Freq (Hz) | Toff |
| A | 4 | 25 | *10* | 0 |
| B | 4 | 25 | *100* | 0 |
| C | 8 | 25 | *10* | 0 |
| D | 8 | 25 | *100* | 0 |

Reverse pulse matrix:

- Reverse pulse shows superior fill compared to DC alone
  - Low current initiation necessary
  - Smallest features filled (0.34μm, 4.5 AR)

- Initial data indicates longer reverse pulse time yields better fill

- 100 Hz clearly shows poorer fill than 10 Hz

- Off time impact not clear

- 5:1 AR Via structure breakpoint
  - Initiation limit-cannot overcome seed deficiency
  - Observed in backfilled via fill (Field 4, 0.21μm, 5:1 AR) also Center voids eliminated on wafer edge and center by reverse pulse plating

*FIG. 33*

Current Sweep Experimental Matrix #1

| Experiment Number | Initial Current (A) | Maximum Current (A) | Time to Max Current (s) | Time at Max Current (s) | Current Sweep (mA/sec) | Total Equiv. Deposition Thick (Å) |
|---|---|---|---|---|---|---|
| 1 | 0.1 | 2 | 25 | 82 | 76 | 2511 |
| 2 | 0.1 | 4 | 75 | 9 | 52 | 2505 |
| 3 | 0.1 | 4 | 60 | 17 | 65 | 2521 |
| 4 | 0.1 | 2 | 60 | 64 | 32 | 2521 |
| 5 | 0.25 | 2 | 50 | 68 | 35 | 2538 |
| 6 | 0.25 | 4 | 90 | 0 | 42 | 2525 |
| 7 | 0.25 | 4 | 45 | 24 | 83 | 2529 |
| 8 | 0.25 | 2 | 90 | 45 | 19 | 2525 |

*FIG. 35*

Note: HCM POR6 seed (2000-2400 Å), .3μ wide

Unipolar Pulse Tests: 0.18 μ Via Wafers

| Wafer Id | Seed Thick | Induction Time | Initiation Time | Initation Conditions | Fill Time | Fill Current |
|---|---|---|---|---|---|---|
| 3106-03 | 1600 Å | 0 seconds | 8 seconds | 5% 20 A 0.5A DC | 15 seconds | 7 A |
| 3106-04 | 1600 Å | 0 seconds | 8 seconds | 2%, 50A 0.5A DC | 15 seconds | 7 A |
| 3106-05 | 1600 Å | 0 seconds | 16 seconds | 5% 20 A 0.5A DC | 15 seconds | 7 A |
| 3106-06 | 1600 Å | 0 seconds | 16 seconds | 2%, 50A 0.5A DC | 15 seconds | 7 A |
| 3106-08 | 1600 Å | 0 seconds | 16 seconds | 5% 20 A | 15 seconds | 7 A |

FIG. 42

Comparison of 0.5 A Initiation: Unipolar Pulsing Conditions
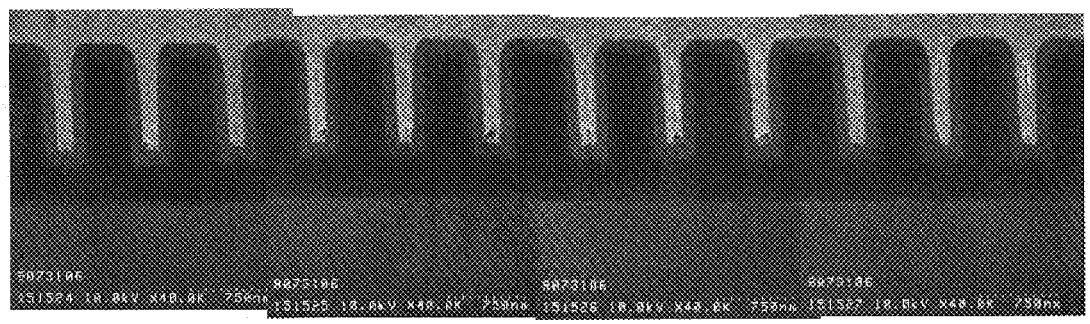
16 sec, 5% 20A
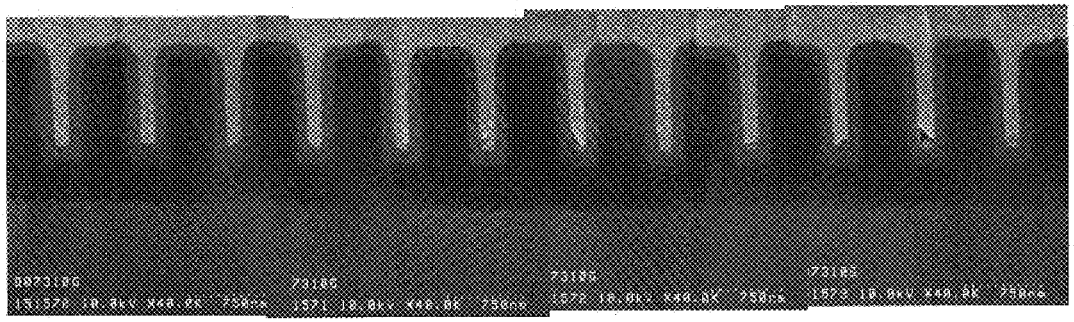
16 sec, 2% 50A
FIG. 45

Comparison of 0.5 A Initiation: With and Without Unipolar Pulsing
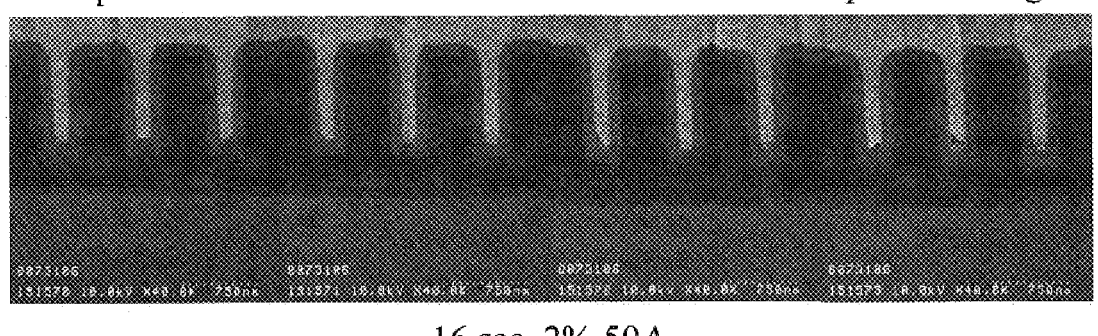
16 sec, 2% 50A
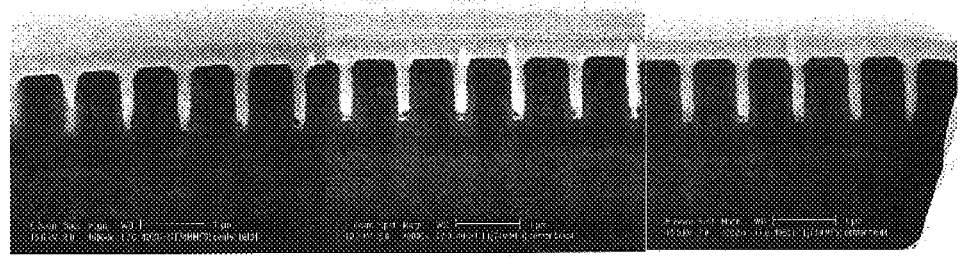
22 sec DC only
FIG. 46

Without Initiation: IMP seed:

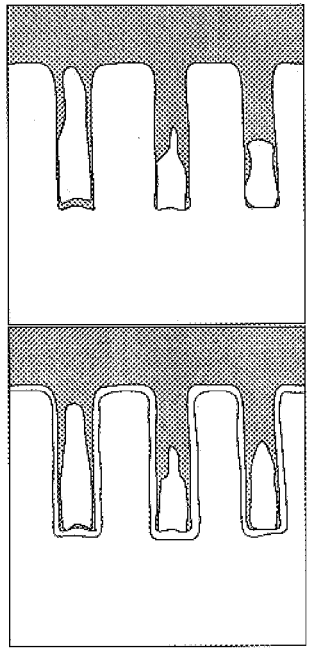

- SEMATECH Backfilled via, Field 3, 0.24 μm x 1.13 μm, AR = 4.7
- Bottom Voids - Yes
- Side wall Voids - No
- Top Void - No
- Center Seam - No
- Film nucleation - poor
- Void % = 90%
- 2 second induction

| Barrier/Seed Layer | Electroplating |
|---|---|
| -IMP<br>-250Å Ta/1600Å Cu<br>-Degas Temp.?<br>-Sputter etch thickness:?<br>-wafer bias:? | -DC, 7 A<br>Bath Conditions<br>$[Cu^{+2}]$ = 17.3 g/l  $H_2SO_4$ = 176 g/l<br>[MLO] = 3 ml/l  [MD] = 8 ml/l<br>$[Cl^-]$ = 55 ppm  Temp = 22°C<br>Flow = 8 lpm  RPM: 125 |

*FIG. 47*

Without Initiation: IMP seed:

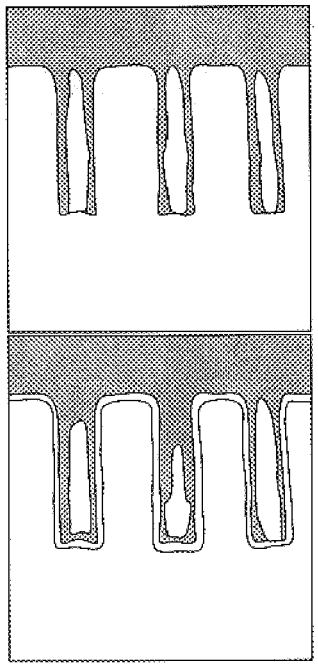

- SEMATECH Backfilled via, Field 3, 0.24 μm x 1.13 μm, AR = 4.7
- Bottom Voids - Yes
- Side wall Voids - No
- Top Void - No
- Center Seam - No
- Film nucleation - poor
- Void % = 70%
- 2 second induction

Barrier/Seed Layer
- IMP
- 250Å Ta/2200Å Cu
- Degas Temp.?
- Sputter etch thickness:?
- wafer bias:?

Electroplating
- DC, 1 A, 15 sec then 7 A

Bath Conditions
$[Cu^{+2}]$ = 17.3 g/l   $H_2SO_4$ = 176 g/l
[MLO] = 3 ml/l   [MD] = 8 ml/l
$[Cl^-]$ = 55 ppm   Temp = 22°C
Flow = 8 lpm   RPM: 125

*FIG. 48*

Without Initiation: IMP seed:

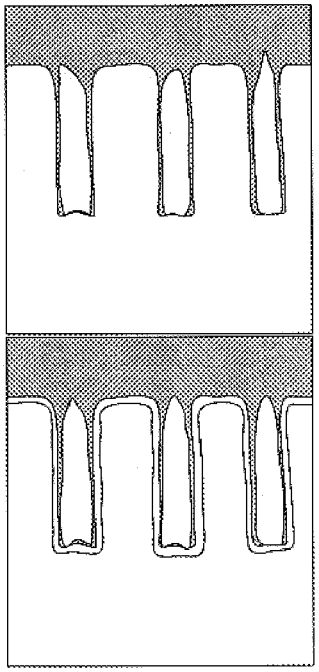

- SEMATECH Backfilled via, Field 2, 0.29 μm x 1.14 μm, AR = 4.0
- Bottom Voids - Yes
- Side wall Voids - No
- Top Void - No
- Center Seam - No
- Film nucleation - poor
- Void % = 90%
- 2 second induction

Barrier/Seed Layer
- IMP
- 250Å Ta/1600Å Cu
- Degas Temp.?
- Sputter etch thickness:?
- wafer bias:?

Electroplating
- DC, 7 A
- Bath Conditions
  - $[Cu^{+2}]$ = 17.3 g/l   $H_2SO_4$ = 176 g/l
  - [MLO] = 3 ml/l   [MD] = 8 ml/l
  - $[Cl^-]$ = 55 ppm   Temp = 22°C
  - Flow = 8 lpm   RPM: 125

*FIG. 49*

Without Initiation: IMP seed:

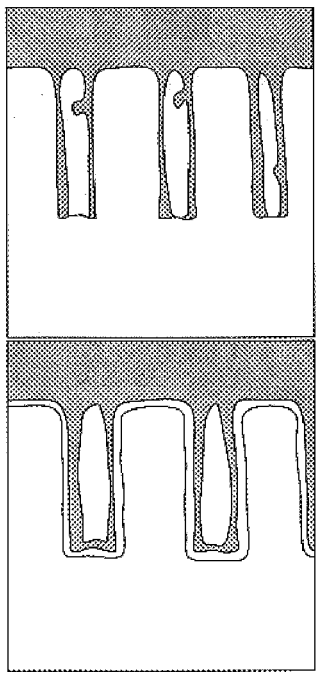

- SEMATECH Backfilled via, Field 2, 0.29 μm x 1.14 μm, AR = 4.0
- Bottom Voids - Yes
- Side wall Voids - No
- Top Void - No
- Center Seam - No
- Film nucleation - poor
- Void % = 60%
- 2 second induction

| Barrier/Seed Layer | Electroplating |
|---|---|
| -IMP<br>-250Å Ta/2200Å Cu<br>-Degas Temp.?<br>-Sputter etch thickness:?<br>-wafer bias:? | -DC, 1 A, 15 sec then 7 A<br>Bath Conditions<br>$[Cu^{+2}]$ = 17.3 g/l  $H_2SO_4$ = 176 g/l<br>[MLO] = 3 ml/l    [MD] = 8 ml/l<br>[Cl-] = 55 ppm    Temp = 22°C<br>Flow = 8 lpm     RPM: 125 |

*FIG. 50*

Initiation: Low current, 2 second induction
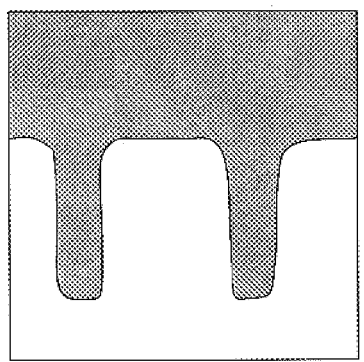
Field 2, 0.29 μm x 1.14 μm, AR = 4.0
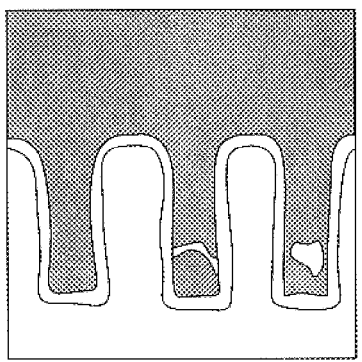
Field 3, 0.24 μm x 1.13 μm, AR = 4.7
• Void % = 1.3%
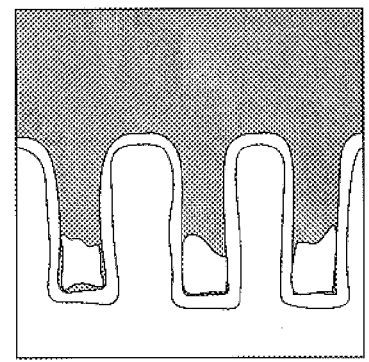
Field 4, 0.2 μm x 1.0 μm, AR = 5.0
• Void % = 15.8%
◆ SEMATECH Backfilled via
◆ IMP Seed
◆ 250Å Ta/1600Å Cu
Electroplating
◆ Step 1: 1A for 15 sec
◆ Step 2: DC, 7 A
Bath Conditions
[Cu$^{+2}$] = 17.3 g/l  H$_2$SO$_4$ = 176 g/l
[MLO] = 3 ml/l  [MD] = 8 ml/l
[Cl$^-$] = 55 ppm  Temp = 22 °C
Flow = 8 lpm  RPM: 125
*FIG. 51*

PROCESS FOR ELECTROPLATING METAL INTO MICROSCOPIC RECESSED FEATURES

REFERENCE TO RELATED APPLICATION

This application is a divisional of U.S. Application Ser. No. 09/410,170 filed on Sep. 30, 1999, now abandoned which claims priority from United States Provisional Patent Application 60/105,699, filed Oct. 26, 1998, which is incorporated herein by reference.

BACKGROUND OF THE INVENTION

1. Technical Field

This invention relates to electroplating and, in particular, to electrochemical deposition of metals, most particularly to the electrochemical deposition of copper into microscopic recessed features such as high aspect ratio trenches and vias as may occur in the fabrication and packaging of integrated circuits.

2. Description of Related Art

The art of integrated circuits is moving irresistibly towards increased density of components and faster operating speeds. One problem encountered in decreasing the size of components fabricated on an integrated circuit relates to the conductivity of metallic interconnections. Conventional integrated circuits use aluminum as a conductor but for future generations of submicron components, the conductivity of aluminum is not sufficiently high to give desired performance. Smaller dimensions for conductive interconnections lead to higher resistance and degraded circuit performance. The trend in modern integrated circuit design is to substitute higher conductivity copper for aluminum conductors.

While copper apparently has sufficiently high conductivity to handle the foreseen submicron electronic components, its use brings challenges as well. For example, copper (Cu) tends to diffuse readily into the insulator and other layers making up the integrated circuit, necessitating the interposition of special barrier layers to prevent Cu diffusion. Tantalum (Ta) and/or tantalum nitride (TaN) are common copper barrier layers. Such barrier layers may play dual roles; preventing unwanted diffusion of Cu and providing improved adhesion between the Cu metal and the underlying layer.

Conductive interconnections on integrated circuits typically take the form of trenches and vias. In modern submicron integrated circuits, trenches and vias are typically formed by a "damascene" or "dual damascene" process as described, for example, in the reference ULSI Technology, Eds. C. Y. Chang and S. M. Sze (McGraw-Hill, 1996, pp. 444–445.) In damascene processing, an interlayer dielectric (typically $SiO_2$) is deposited atop a planarized layer containing, for example, a metal via. The top dielectric layer is patterned and etched, typically using conventional photolithographic procedures. Metal is then deposited into features and on the flat field region atop the features, typically first by CVD, PVD and then by electrodeposition. The metal layer is typically planarized resulting in the desired metallic pattern. Dual damascene processing is similar but makes use of two patterning and etching steps and typically fills features with metal spanning more than one layer in a single metallization step. A more complete description of damascene and dual damascene processing is found in the cited reference.

Thus, as the art moves towards integrated circuits having reduced feature sizes, it becomes increasingly difficult to form electrically conductive metallizations such as vias, contacts and conductors. Techniques for forming such metallizations include physical vapor deposition (PVD), chemical vapor deposition (CVD), plasma enhanced chemical vapor deposition (PECVD) and electrochemical deposition (also referred to as electroplating or electrodeposition) of metals such as copper. Electroplating is particularly well suited for the formation of small embedded damascene feature metallization due to the ability to readily control the growth of the electroplated film for bottom-up filling without voids, and due to the superior electrical conductivity characteristics of the electroplated film. However, there are also several obstacles which need to be overcome to fully realize these advantages.

One challenge facing dual damascene processing techniques noted above is the difficulty of initiating the growth of the metal film within recessed features without forming voids or seams. In typical PVD and some CVD processes, metal may preferentially deposit near the top of recessed features leading to a "bottleneck" shape. Further plating of metal onto the bottleneck may result in sealing the top of the feature before completely filling the feature with metal, creating thereby a void. Voids increase the resistance of the conductor over its designed value due to the absence of planned-for conductor. Also, trapped electrolyte sealed in voids may corrode the copper. This may lead to degraded device performance or device failure in extreme cases. It would be desirable to provide electroplating processes that reduce or avoid such problems.

Another factor in metallization that needs to be considered is the time the metallization process takes to complete. As integrated circuits increase in complexity, the number of processing steps typically also increases. It is important in process economics (that is, keeping the cost per unit low) that such processes are reasonably rapid. Slow processes are disadvantageous in that increasing the workin-progress increases the capital needs of the production process. A related consideration is the cost of the equipment needed to perform the required plating process. Thus, achieving reasonably high processing speeds and the ability to use less costly equipment are among the goals to be sought in an electroplating process.

A field layer of copper typically has a thickness from approximately 1000 Å to approximately 3000 Å lying atop a barrier layer of typically tungsten (W) Ta, TaN among other choices. Ta/TaN are the typically preferred materials for the barrier layer due to their relatively superior ability to mitigate the diffusion of Cu. Diffusion of Cu into the dielectric layer may ruin the circuit. An additional function of the barrier layer is to provide improved adhesion between the Cu field layer and the underlying dielectric layer. These barrier layers typically have thicknesses from approximately 100 Å to approximately 400 Å.

FIG. 1 is a top plan view of a typical section, 12, of a substrate, 10. Substrate 10 can be any article to be electroplated such as a semiconductor wafer upon which integrated circuits are fabricated. Formed in (or in a layer lying over) substrate 10 may be one or more trenches (a typical example is denoted by 14) and vias 16, 16a, 18. Although only a single trench 14, and three vias 16, 16a and 18, are illustrated for simplicity of discussion, it is understood that typically a large number of trenches and vias may be formed in substrate 10. It is common in a typical damascene or dual-damascene structure occurring in the fabrication of integrated circuits that vias occur in trenches to provide electrical contact between a conducting trench and a different level. This is depicted as 16a in FIG. 1. However, it is more convenient to describe trenches and vias in a non-overlapping configuration as depicted by 14, 16 and 18 for purposes of illustration, understanding thereby that vias occurring in trenches, 16a, are included.

Trench 14, vias 16, 16a and 18 are typically filled with an electrically conductive material such as a metal, e.g. copper, to form electrically conductive metallizations. For example, trench 14 may be filled to form a single layer conductor. As further examples, vias 16, 16a and 18 may be filled to form electrically conductive vias between interlevel conductors or to form contacts with semiconductor regions.

While a typical Cu seed layer onto which Cu is electroplated is 1000 Å to 3000 Å thick, the feature widths to be plated are commensurate in size. Present features are around 3000–4000 Å (0.3–0.4 micron, μm) and future features are expected to be in the range 1000–2000 Å. Thus, the number and size of the features can have a significant fractional effect on the projected surface area to be bottom-up fill electroplated and, therefore, on the current that must be delivered to effect electroplating in a reasonable time.

FIG. 13 depicts the effect of increasing the number of features on the current required to fill the trenches (for a fixed fill time). This means that the current required to fill features in a specified amount of time increases with the fraction of features on the surface. In addition to process economics, we demonstrate herein that the process of the present invention make use of the time for electrochemical reactions to occur on surfaces in effecting proper metal filling of features. Thus, the number of features on the surface to be coated (feature density) as well as the aspect ratio of the features determine the current needed to effect plating in a specified time.

FIG. 14 depicts the increase in surface area as an increasing fraction of the surface contains features, also illustrating the effect of increasing aspect ratio "AR," for either trench or via. FIG. 14 presumes all trenches or all vias are the same size for purposes of illustration while practical integrated circuits will have both. This reinforces the conclusion of FIG. 13 that current may vary substantially from case to case (wafer type to wafer type) depending on the density and characteristics of the features.

FIG. 2 is a cross-sectional view of substrate 10 along the line 11—11 of FIG. 1. Referring to FIGS. 1 and 2, a seed layer 20 is typically formed over the entire substrate 10. Seed layer 20 is typically a conductive layer overlaying a barrier. The conductive layer is typically a sputtered (PVD) copper film although other conductors and other methods of deposition (such as CVD, PECVD, etc.) are not excluded. The barrier layers are typically Ta, TaN, Ti, TiN. The function of the seed layer is to allow electrical current to be distributed across substrate 10 thereby facilitating electroplating. Seed layer 20 typically covers the flat principal surface 22 of substrate 10 (hereinafter "field region 22") and also lines the inside of trench, 14, and vias 16, 16a and 18.

In conventional electroplating, the thickness of seed layers 20 on sidewalls 14S, 16S, 18S of trench 14, vias 16, 18, respectively, is commonly significantly less than the thickness on field region 22. This can be understood by considering a simple geometric model wherein seed layers 20 are assumed to be deposited uniformly on field region 22 and the material which would have been deposited on field region 22 over trench 14, via 16 or 18 is evenly distributed within the respective trench or via. Thinning of the deposited layers in trenches and vias occurs according to this model due to the geometric fact that the trench or via presents more surface area to be coated by a given amount of coating material than would a substantially flat field region. It is useful to consider such layer thinning in terms of the aspect ratio ("AR") of the feature. The AR of a trench or via is defined as the ratio of depth to width of the feature. Vias are depicted as square in FIG. 1 for convenience only. Vias can be square, circular or other cross section. The discussion of vias herein illustrated by reference to square vias is readily modified to apply to circular vias or to vias having other shapes as well. The AR is thus taken to be the ratio of the via's depth to a typical linear dimension in the plane of field region 22. A more precise definition of AR is not necessary for a description of the present invention.

Sidewall thinning according to this model is illustrated in FIG. 3. which depicts on the vertical axis the ratio of the feature sidewall thickness (trench or via) to the field region thickness of seed layer 20 depicted as a function of the AR of the feature. As shown in FIG. 3, as the AR becomes large, the thickness of seed layer 20 on sidewalls 14S, 16S, 18S can decline to less than 10% of the thickness of seed layer 20 on the field region 22.

In practice, the difficulty of depositing metal uniformly on the sides of trenches and vias to form a seed layer is further exacerbated by the following effects: 1) The generally directional nature of the PVD sputtering process, 2) greater deposition at the opening of the feature ("necking") and 3) The relative inaccessibility of the feature to species transported by diffusion. Thus, in practice the portions of the sidewalls near the bottom of the feature tend to receive the thinnest seed layer.

Referring again to FIG. 2, the relative thinness of seed layer 20 on sidewalls 16S (for example) results in a relatively high electrical resistance R between field region 22 and the bottom 16B of via 16. This resistance R impedes electroplating current distribution-to bottom 16B and consequently inhibits or prevents formation of an electroplated layer on bottom 16B. For similar reasons, increased resistance results between seed layer 20 and 14B, 18B, inhibiting or preventing formation of an electroplated layer on the bottom 14B of trench 14, and 18B of via 18, respectively. Similarly, increased resistance results between seed layer 20 and 14l, 18B.

FIG. 4 is a cross-sectional view of substrate 10 along the line II—II of FIG. 1 after electroplating in accordance with conventional electroplating methods. As shown in FIG. 4, an electroplated layer 24 has been electroplated on substrate 10 and in trench 14, vias 16, 18. Often due to the increased resistance encountered in delivering current to bottom 16B of via 16, a teardrop shaped void 26 can be formed in via 16 by such electroplating methods. The specific shape of the voids or seams formed in a feature generally depends on the AR of the feature, the electroplating conditions and other factors.

Since via 18 has a smaller AR than via 16 (in this illustration), seed layer 20 may have a thickness on sidewalls 18S sufficient to support an electroplating current to bottom 18B. Nevertheless, seams/voids may form, depicted as 28, if conditions for bottom-up filling (current, electrolyte, additive concentration, etc.) are not achieved.

Voids and seams in electroplated features are undesirable for several reasons. Voids and seams disrupt the electrical continuity of the resulting metallization and hence unpredictably increase the electrical resistance. In extreme cases, voids and/or seams may result in an open circuit. Furthermore, the voids and seams can trap impurities, including the acid plating solution. Entrapped acid plating solution can corrode the circuit and add significant internal pressure as the circuit/chip heat during operation. Device failure may result.

Accordingly, the present invention relates to an improved method of reliably electroplating high AR features including methods of reducing or eliminating the formation of voids and seams in electroplated features.

BRIEF SUMMARY OF THE INVENTION

Electroplating metals onto semiconductor surfaces is one common way for providing metal contacts and conductors in the manufacture of integrated circuits. However, as integrated circuit features become ever smaller, electroplating without the formation of seams and/or voids becomes more challenging. The present invention identifies several sources of such seams/voids within the electroplating process and describes several mitigating techniques.

Deposit of a conducting seed layer onto a substrate and microscopic recessed features often does not provide adequate metallization of the feature walls, leading to poor electroplating. The poor electrical quality of feature sidewalls and bottom is observed to worsen when the substrate is brought into contact with the electroplating solution. The present invention describes techniques of cathodic polarization to avoid the exacerbating effects of contact with electroplating solutions.

Avoidance of seams/voids requires bottom-up filling of recessed features. The present invention describes diffusion-controlled electroplating in which additives that suppress electroplating are preferentially removed from the feature bottom, leading to preferential electroplating of the bottom and, hence, bottom-up filling.

Bottom-up filling requires adequate electrical conductivity from the field region of the substrate to the bottom of the feature. A preliminary plating step is described in the present invention leading to thin films of conductor from the field region to the feature bottom. These films are deposited by an electrodeposition process making use of electroplating-suppressing additives to insure uniform film formation.

As bottom-up filling proceeds, high aspect ratio features become low aspect ratio features, amenable to conformal electroplating techniques to finish the filling of trenches and vias. Techniques for filling very low AR features ("pads") in reasonable short processing times are also described.

BRIEF DESCRIPTION OF THE DRAWINGS

All drawings are schematic and not to scale.

FIG. 5A is an enlarged view of region 100 of FIG. 2 illustrating early stage degradation of seed layer.

FIG. 5B is an enlarged view of region 100 of FIG. 2 illustrating corrosion of copper layer and oxidation of tantalum layer likely to occur in conventional electroplating.

FIG. 6 is an enlarged view of region 100 of FIG. 2 following the initiation phase of the present invention.

FIG. 15 demonstrates that for typical additive concentrations present in electroplating baths, the initial additive present in trenches and vias is insufficient to coat the feature surfaces with a significant fraction of a monolayer, leading to an initial period of effectively additive-free plating behavior in features.

FIG. 16 shows the estimated induction period for plating additive adsorption inside features.

FIG. 17 shows the estimated induction period for adsorption of plating additives.

FIG. 19 shows the equivalent circuit model for trench and via filling.

FIG. 20 illustrates model calculations for the effective electrical resistance and voltage drops in the filling of small features.

FIG. 21 is a graphical depiction of nucleation phenomena in features.

FIG. 23 shows the results of bipolar pulse plating waveform for filling phase depicting improved filling with anodic pulse (right) in comparison with dc process (left).

FIG. 24 is a summary of optimization for bipolar pulse plating for filling phase derived from series of experimental results for various types of pulse plating waveform. Generally, higher anodic currents improve top filling (avoidance of voids near the top of features). Lower cathodic currents tended to improve filling.

FIGS. 25–32 are examples of bipolar pulse plating waveforms for the filling phase 3.

FIG. 33 is a summary of conclusions derived from tests depicted in FIGS. 25–32.

FIGS. 35 and 36 show experimental current sweep for various sweep and current conditions for phase 3 bottom-up filling. The results demonstrate current sweeping is effective in bottom-up filling of all aspect ratio features as well as bottom-up filling repair.

FIG. 42 relates to the initiation phase of FIG. 41 and various conditions tested.

FIGS. 44–46 depict the relative merits of unipolar pulsing or the lack thereof in the initiation phase, phase 2.

FIG. 47 relates to phase 1 entry phase and an induction period of 2 seconds following the entry of the wafer into the plating bath before a current of 7 amps is turned on. Poor film nucleation is observed. Electroplating bath conditions are given. MLO and MD are components of Enthone Cu-Bath-SC™.

FIG. 48 has the conditions of FIG. 47 but the initial 7 amp current (after a 2 second induction period) ramps up to 7 amps over a period of 15 seconds. Film nucleation marginally better than FIG. 47 is observed, but still classified as poor.

FIG. 49 duplicates the plating conditions of FIG. 47 but for a feature having a smaller AR.

FIG. 50 duplicates the plating conditions of FIG. 48 but for a feature having a smaller AR.

FIG. 51 shows 2 second induction delay in applying current in phase 1, entry phase. Two step application of current is depicted, 1 amp for 15 seconds followed by 7 amp.

DETAILED DESCRIPTION OF THE INVENTION

Figure 1:
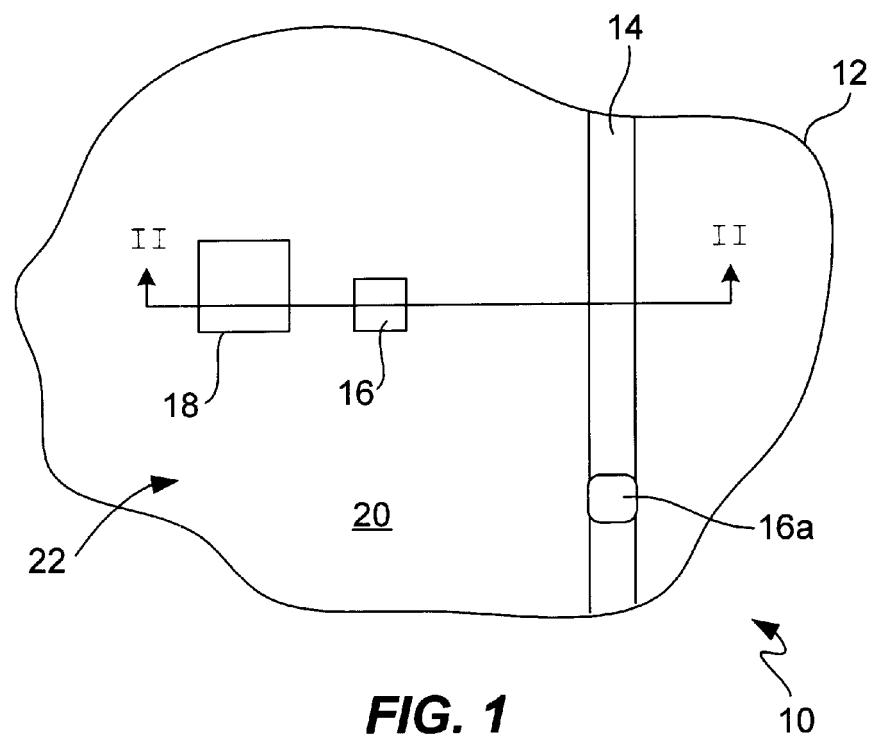
FIG. 1 is a top plan view of a section of a typical substrate to be electroplated.

In the following description and figures, similar reference numbers are used to identify similar elements.

The present invention is directed towards the plating of copper onto the surfaces of high AR features as would typically be encountered in the fabrication of integrated circuits. However, it is not the intent of the present inventors that the invention be inherently so limited. Procedures described herein will find application in other areas of the field of electrodeposition. However, to provide concrete and definite expression, we describe in detail herein, the plating of copper.

Typical electroplating baths will contain the metal to be plated, the associated anions in a typically acid solution. Copper electroplating is typically performed from a solution of $CuSO_4$ dissolved in an aqueous solution of sulfuric acid. In addition to these major constituents of the plating bath, it is common for plating baths to contain several additives. "Additives" is intended to mean herein any type of compound added to the plating bath to change the plating behavior. Additives are typically, but not exclusively, organic compounds. Typically, additives are present in low concentrations in the plating bath. Additive concentrations in the range of parts-per-million (ppm) are typical, perhaps 20 to 400 ppm.

There are three general types of plating bath additives of interest in the practice of the present invention. Suppressor additives retard the plating reaction, increasing the polarization. Typical suppressors may be large molecules (for example, polymers) that may have an ionic end group, for example a surfactant. Increasing the surface polarization layer prevents the copper from adsorbing onto the surface. Suppressors can thus function as blockers. Suppressors cause the resistance of the surface to be very high in comparison to the electrolyte diffusion or electrical resistance. Often ppm levels of chloride ion are required for suppressers to be effective.

Accelerator additives (catalysts) accelerate the plating reaction. Accelerators may be rather small molecules, perhaps containing sulfur and need not be ionic. Accelerators absorb onto the surface and increase the current. Accelerators may occur not as the species directly added to the electroplating bath, but as breakdown products of such molecules. In either case, the net effect is to increase current flow and accelerate the reaction when such species are present (or become present through electrochemical breakdown).

Levelers behave like suppressors but tend to be more electrochemically active than suppressors and typically are consumed during plating. Levelers also tend to accelerate plating on depressed regions of the surface undergoing plating, tending thereby to level the plated surface. The above descriptions of additives are intended to be qualitative only. Specific additives are described elsewhere herein.

In addition, additives adsorbed on the surface may undergo breakdown as voltage is increased, forcing current through the surface in spite of the adsorbed species. These breakdown products typically accumulate in recessed regions of the surface (that is, in regions less accessible to diffusion of species from the bulk electroplating solution).

Such accumulation of breakdown products in recessed regions aid in that region becoming active for plating in such recessed regions.

The additives used in the practice of the present invention affect plating behavior both by their chemical and physical behavior. Additives chemically affect the plating behavior according to their intent. However, additives undergo chemical transformation to a greater or lesser extent as the reaction proceeds. The chemical and physical properties of the reaction products may also have an effect on the plating processes of the present invention.

The present invention is concerned chiefly with the filling of small, recessed features typically having high ARs. Thus, the present invention is directly concerned with properties of the plating bath and the plating process inside vias and trenches. Diffusion of species in and out of such regions is an important consideration in the present invention as described in detail elsewhere herein.

One of the first considerations in evaluating the effects of additives on plating is to estimate the amount of additive present in vias and trenches before plating begins. That is, when the surface to be plated is introduced into the plating bath, what amount of additive material may be expected to be found inside vias and trenches? This estimate is given in FIG. 15. FIG. 15 gives typical ppm levels for additives in plating baths and the estimated amount of additives to be found in vias and trenches. The calculations of FIG. 15 lead to the conclusion that there is insufficient additive initially resident in the interior of typical features to coat the interior walls of the features by a significant fraction of a molecular monolayer. In other words, if all additives initially present inside features were to deposit on the walls immediately at time t=0, there would be insufficient concentration on the walls to have a significant effect of the type the additive is intended to have. Thus, the effect of additives on the plating behavior inside features is subject to a time delay or induction period. During this induction period, additional additive molecules diffuse into the vias and trenches to deposit on the walls thereof and cause the intended behavior. However, it is important in the practice of the present invention that the additive induction period inside trenches and vias be recognized and utilized. FIG. 16 estimates that this induction period is of the order of 2 to 3 seconds. These numbers are intended to be qualitative estimates only to demonstrate an induction period of the order of seconds rather than microseconds or hours. Different induction periods will occur for different additive species depending on their diffuisivity in the plating bath and under the particular conditions of current and voltage. Ionic additives (for example, chloride) and small organic molecules will be expected to diffuse more rapidly than large, uncharged species. But, for an induction period of the order of seconds, the walls of the features to be plated seem to be in contact with a substantially additive-free electrolyte. Thus, during this induction period the walls of the features are taking up (adsorbing) additional additives and increasing the property the additive brings to the plating process.

There are other factors tending to keep features additive-free in addition to the small amount of additive initially brought into the feature with the plating bath. Typically, additives will be adsorbed onto the walls of the features as well as onto the (much larger) field region. As more additive diffuses to the surface from the plating bath, adsorption onto the field region will predominate over diffusion into the feature and adsorption onto the feature walls. In addition, with the passage of time the additives adsorbed onto field regions will be chemically broken down, thereby freeing adsorption sites on the easily accessible field region. The net effect is that the interior of the features plates as if plating from an additive-free bath for some induction period at the beginning of the plating process before additives reach equilibrium between residence in the plating bath and adsorption on the feature walls. See FIG. 17.

In accordance with the present invention, a method of electroplating is presented which is particularly well suited for electroplating small features having high AR. Additionally, embodiments of the present invention relate to processes of electroplating a substrate having features with various ARs in a manner efficiently producing good quality coating for all such features.

The present invention typically includes four distinct phases designed to reduce or eliminate one or more problems commonly associated with conventional electroplating of recessed features.

As noted above, the initial PVD copper deposition typically results in thin copper seed layers on the walls and bottoms of trenches and vias. In addition to being thin, the morphology of the coating on walls/bottoms of trenches/vias can be non-uniform, consisting of isolated islands of copper lying on an underlying layer of tantalum (or other material). If exposed to oxygen or water, a tantalum oxide layer may form. This oxide layer may constitute the entire thickness of the Ta film. The inventors have observed that placing a substrate having such islands into an electrolyte plating bath generally exacerbates wall/bottom non-uniformity, likely due to spontaneous electrochemical etching. Thus, the first phase, referred to as "the entry phase," includes procedures to reduce or avoid etching and corrosion of the copper seed layers within the features and thereby maintain the integrity of the seed layer for subsequent phases.

As the first, entry, phase avoids exacerbating the wall/bottom non-uniformity, the second or "initiation phase" tends to selectively repair the non-uniformity in the recessed features. This initiation phase includes nucleation and growth resulting in island-bridging of the seed layer non-uniformity within the features. During the initiation phase, the seed layer within the features is overlaid with another layer that is more uniform and has desired bottom-up filling properties.

The features next must be filled with conductive material in such a manner as to reduce or eliminate the formation of seams and/or voids. It is found that features having ARs typically in excess of 0.5 ("high AR") require different electroplating conditions from those having low ARs (less than approximately 0.5) in order to achieve electroplating with seam/void reduction (or elimination). It is useful to describe the present invention in terms of the different conditions required for filling high and low AR features as two separate phases. However, as high AR features fill according to the desired bottom-up manner, the feature's AR decreases. In actual practice of the present invention in some of its embodiments, the electroplating conditions are changed in a continuous manner to achieve filling of first high then low AR features smoothly. However, to make the discussion more definite, we consider the filling of high AR features separate from filling of low AR features.

The filling of high AR features according to the present invention is referred to as "the bottom-up electrofilling phase." This phase involves the deposition of electrically conductive material preferentially onto the bottoms of the high AR features. The formation of seams and voids is reduced or avoided for features of all sizes and ARs in this phase while preferentially electroplating conductive material onto the bottoms of high AR features.

The fourth phase, referred to as "the low AR feature filling phase," involves the electroplating of electrically conductive material into low AR features, typically with an AR less than 0.5. This fourth phase is carried out pursuant with the present invention with the reduction/elimination of seams/voids.

Some embodiments of the present invention can be practiced without the use of high-current pulsed power supplies. This results in cost savings both in the use of less expensive power supplies and also in avoiding the costs of associated hardware (wiring, contacts, etc.) typically required by high-current pulsed power supplies.

1. The Entry Phase

Figure 2:
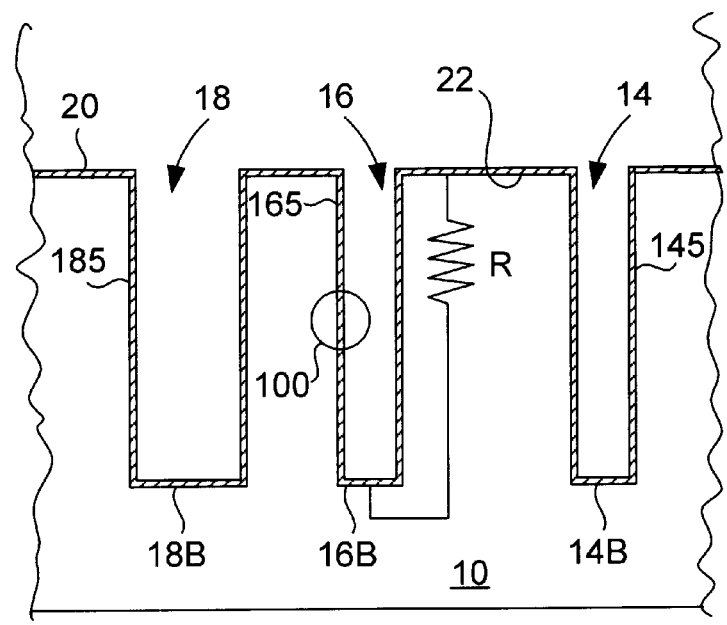
FIG. 2 is a cross-sectional view of the substrate along the line II—II of FIG. 1.
Figure 3:
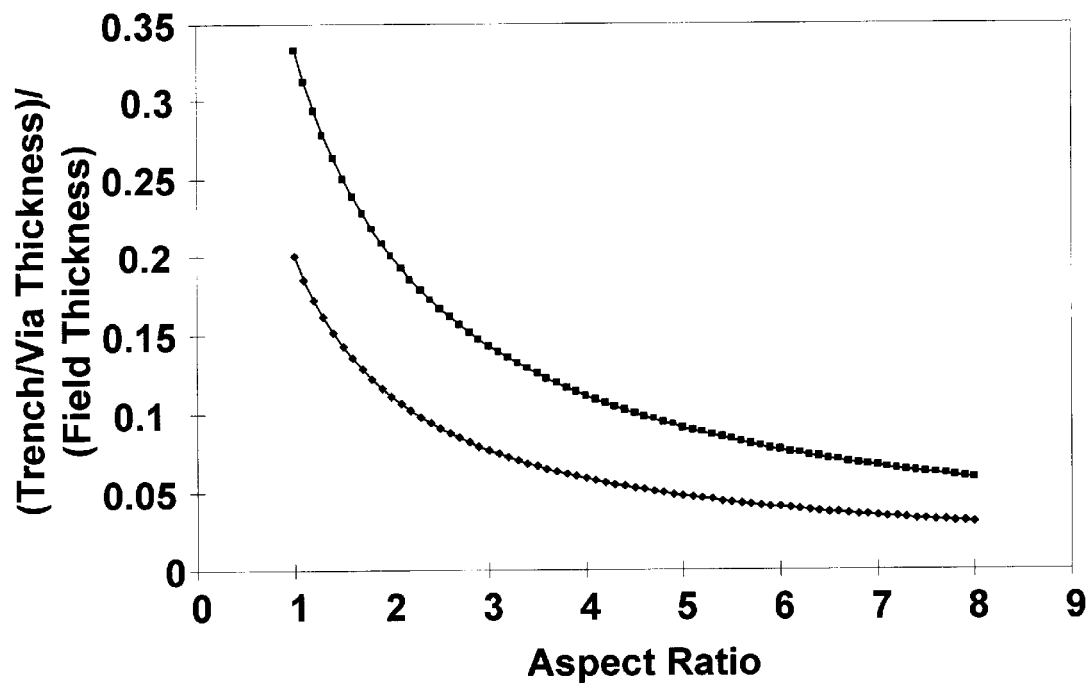
FIG. 3 is a graph of the ratio of feature sidewall thickness to the field region thickness of a seed layer versus the respective feature AR.

FIG. 5A is enlarged view of the region 100 of FIG. 2 illustrating early stage degradation of seed layer 20 as observed by the inventors. In this example for purposes of providing a concrete illustration, seed layer 20 includes a tantalum layer 102 and a copper layer 104. Illustratively, tantalum layer 102 may have a thickness typically in the range of 200–350 Å on field region 22 and copper layer 104 may have a typical thickness in the range of 800–2000 Å on field region 22 although layers of other materials and/or having other thickness can also be used. Thicknesses in trenches and vias are typically 10% of the field region values. As shown in FIG. 5A, copper layer 104 is often seen to form agglomerates or islands 106 of copper. Consequently, regions of tantalum layer 102 are exposed between islands 106.

FIG. 5B is an enlarged view of the region 100 of FIG. 2 illustrating corrosion of copper layer 104 and oxidation of tantalum layer that is likely to occur in conventional electroplating procedures. As shown in FIG. 5B, the exposed regions of tantalum layer 102 are subject to oxidation, thereby forming patches or regions 108 of tantalum oxide in tantalum layer 102. Regions 108 are thus regions of relatively high electrical resistivity compared to the remaining unoxidized portions of tantalum layer 102. This behavior of tantalum layer 102 represents one impediment to adequate and uniform distribution of electroplating current to bottom 16B of via 16 (FIG. 1).

Figure 18:
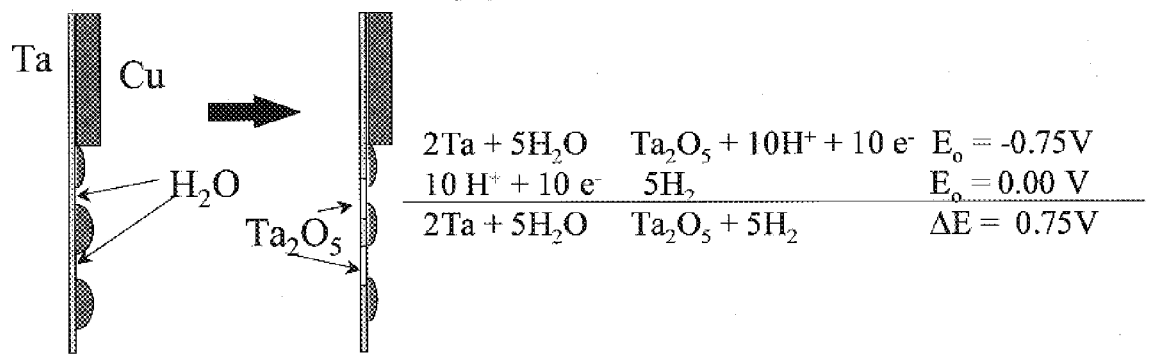
FIG. 18 illustrates the thermodynamic basis for the formation of $Ta_2O_5$ on feature sidewalls.
Figure 22:
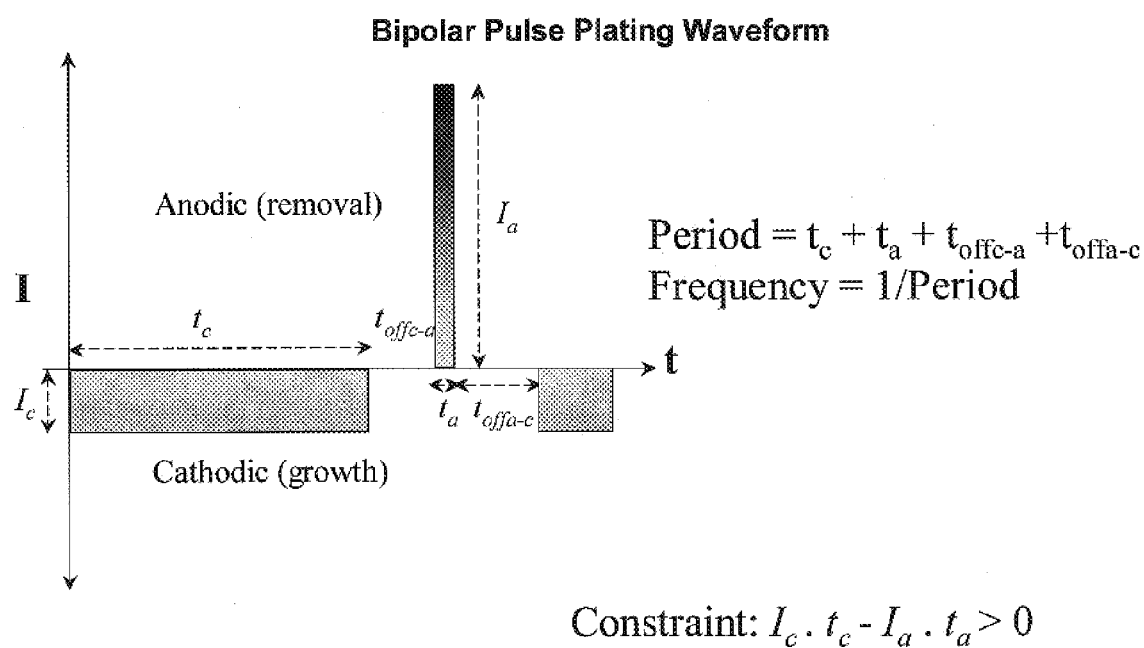
FIG. 22 is an example of a possible bipolar pulse plating waveform appropriate for the filling phase (phase 3), depicting cathodic (growth/deposition) current, off time, anodic time during which copper is removed (re-dissolved), potentially another off time and resumption of the cathodic current. To insure net plating of copper, the time-current relationship must obey the constraint that the time-integrated cathodic current exceed the time-integrated anodic current. This bipolar pulse plating waveform may be particularly useful in preventing the formation of bottlenecks as the anodic pulse can remove developing bottlenecks. Typical anodic currents are longer than about 5–10 milliseconds in duration.
Figure 27:
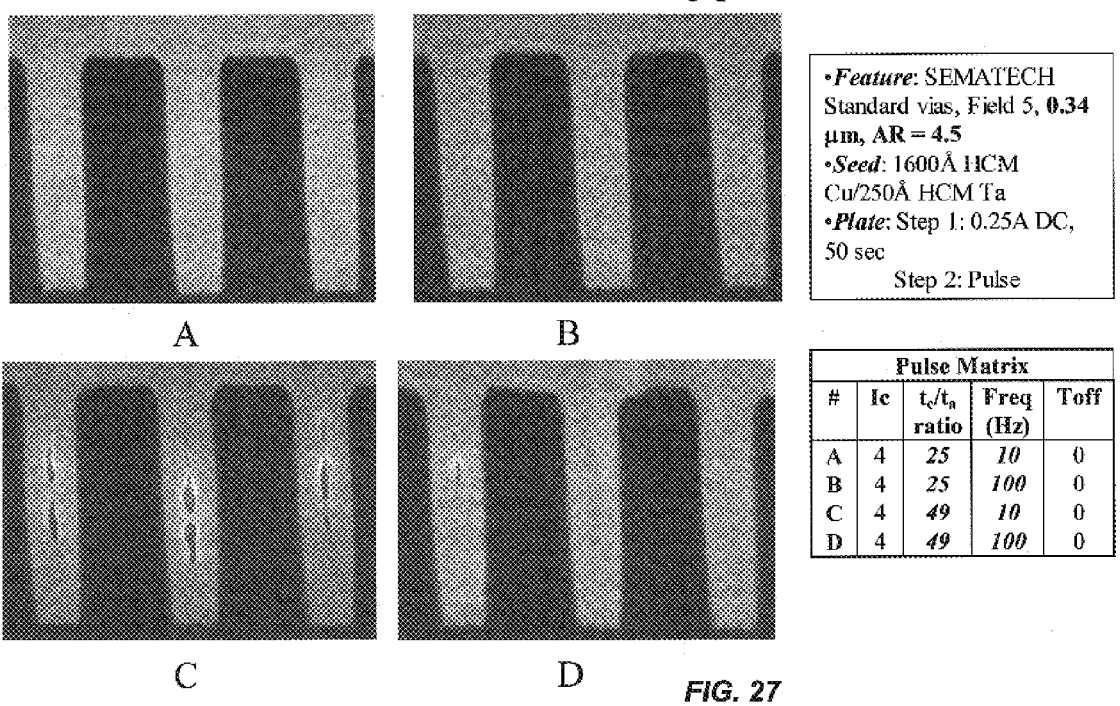
Figure 28:
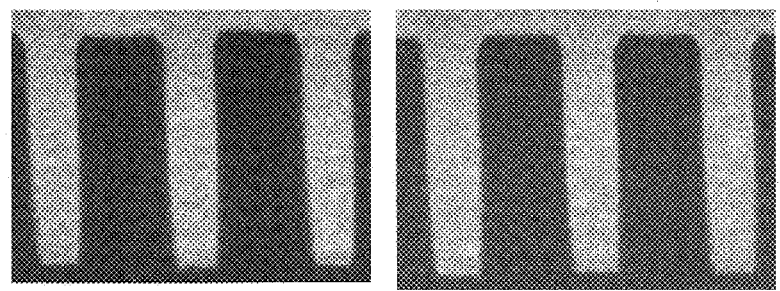
Figure 31:
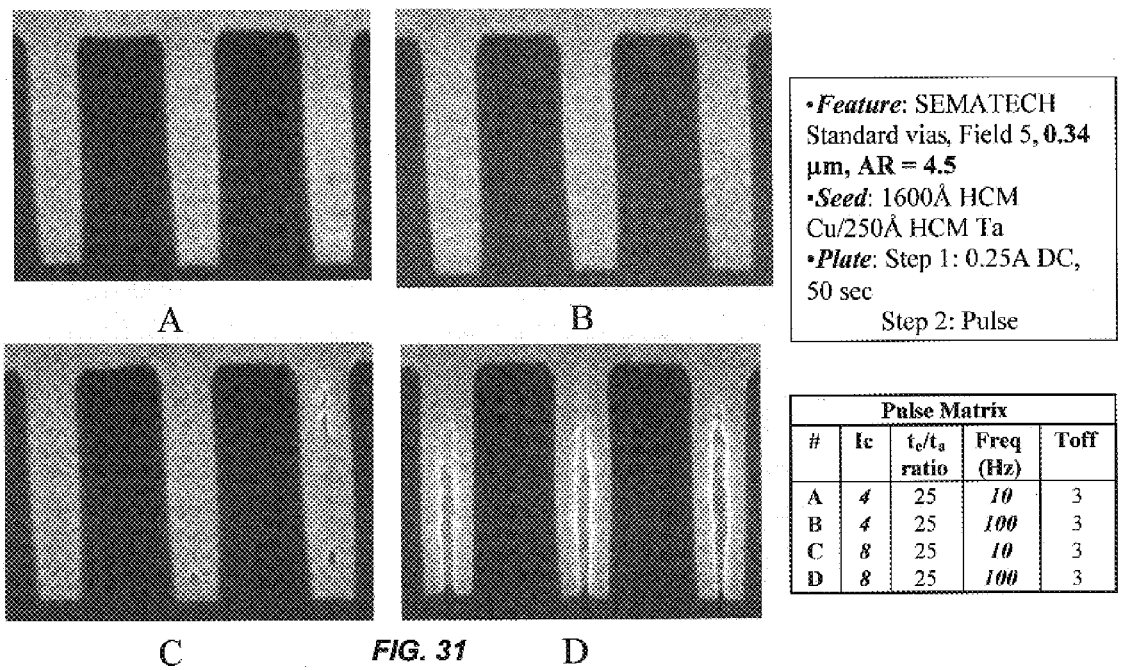
Figure 32:
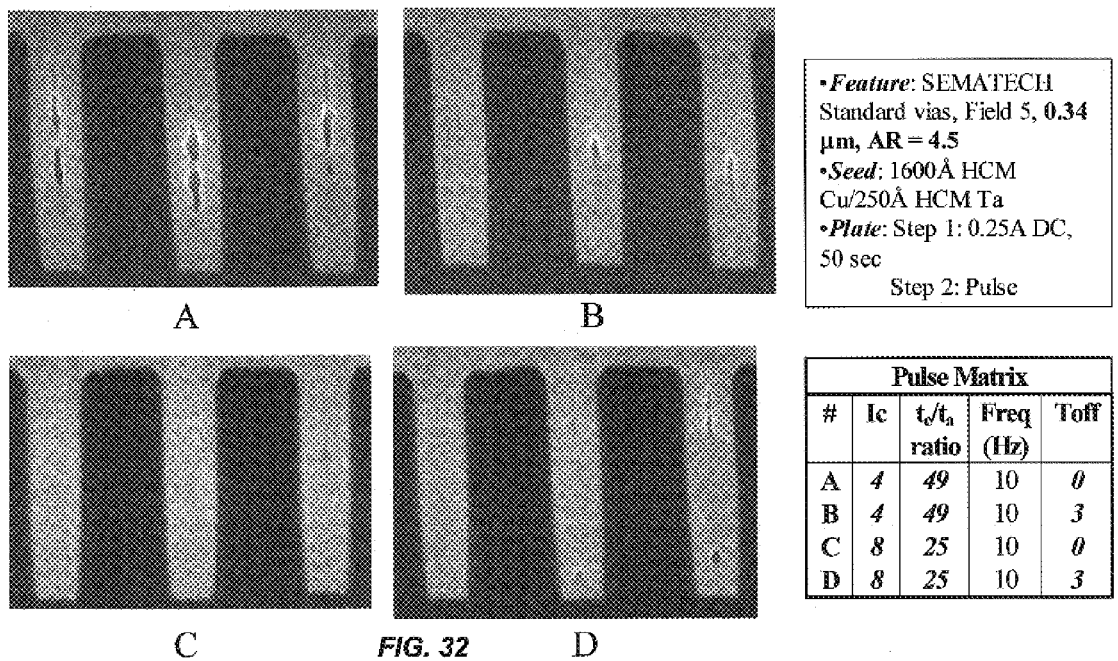
Figure 34:
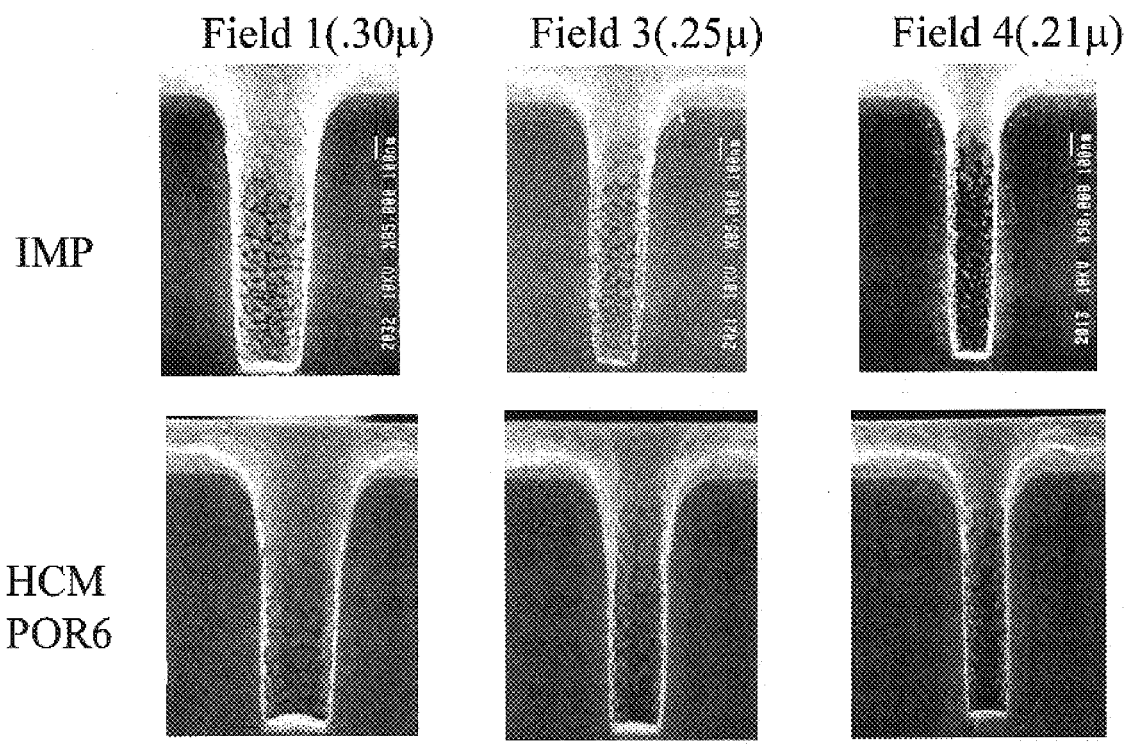
FIG. 34 is a comparison of Hollow Cathode Magnetron ("HCM") PVD deposition with Ionized Magnetized Plasma ("IMP") PVD deposition showing more severely discretized films on the feature walls resulting from the IMP process as well as more pronounced necking effects.
Figure 36:
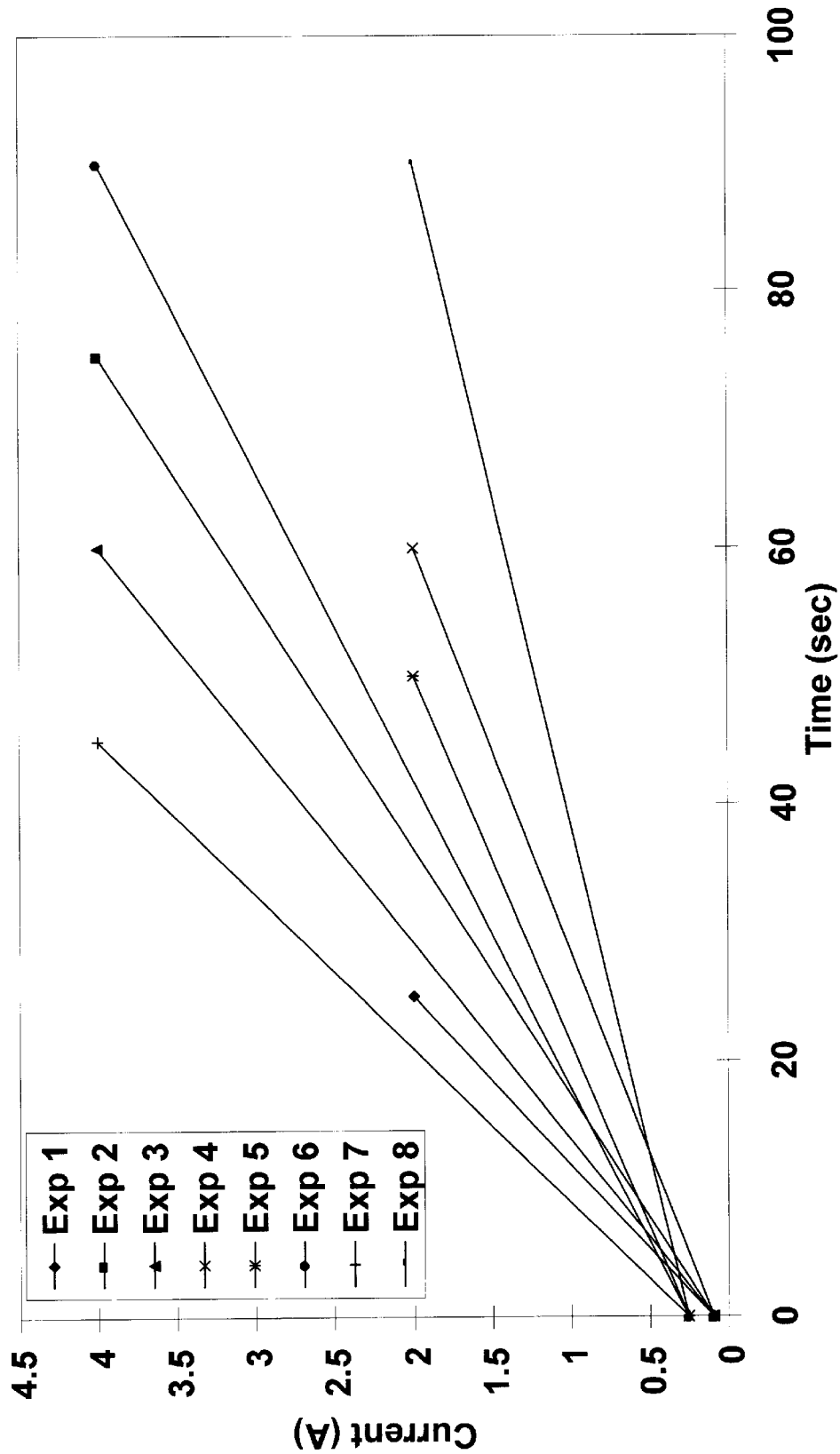

Referring now to both FIGS. 5A and 5B, and FIG. 18, copper layer 104 is typically continuous near the top of the feature and tends to be discontinuous ("island-like") near the bottom of the feature. As noted above, shadowing by the feature walls and diffusion-accessibility explain preferential copper deposition near the top of features. The underlying Ta layer is converted to oxide, 108, where exposed to humidity, water or oxygen. Thus, a region comprising islands of conductor, 106, atop a continuous layer of oxide, 108, acts largely as an electrical insulator, failing to distribute electroplating current to bottom of features. The reactions of interest are:

$$2Ta + 5H_2O \rightarrow Ta_2O_5 + 10H^+ + 10e^- \quad E_0 = -0.75 \text{ V} \quad (1)$$

$$10H^+ + 10e^- \rightarrow 5H_2 \quad E_0 = 0.00 \text{ V} \quad (2)$$

$$2Ta + 5H_2O \rightarrow Ta_2O_5 + 5H_2 \quad \Delta E = 0.75 \text{ V} \quad (3)$$

resulting in an insulating layer of $Ta_2O_5$, exacerbating the difficulty in getting electricity to the bottoms of the sidewalls of the feature. This is among the problems making plating of the interior walls of vias and trenches, especially the lower walls, particularly difficult. We have effectively isolated islands of copper atop an insulating layer of tantalum oxide.

FIG. 19 illustrates an equivalent circuit model for the electrical behavior of the interior surfaces of features. $R_f$ is the film resistance which is reasonably high due to the presence of tantalum oxide along the sidewall. There are two interfacial resistances, $R_{ct}$ that indicates the resistance of electron transfer across the interface, charge-transfer resistance, or the coupling resistance between a copper ion in solution and an electron on the surface combining with the copper ion. W denotes diffusion resistance for copper ions. In the presence of a tantalum oxide surface, $R_f$ is large and electrons prefer the route at the top of the trench, leading to top-of-trench plating, bottlenecking and a poor filling of the feature.

FIG. 20 presents model calculations for the effective electrical resistance and voltage drops to be expected to occur in the filling of small features. Two conclusions result. If metallic tantalum remains, electrical resistance to the bottom of the feature is small. If tantalum oxide is present, the electrical resistance to the bottom of the feature will be large and require special processing to support bottom-up filling.

The inventors observe that when substrate 10 is placed in an electroplating bath, further degradation of the copper layer within trenches and vias is the typical result. This may be due to a corrosion reaction quickly oxidizing copper layer 104. The corrosion reaction may involve a redox reaction between dissolved oxygen in the electrolyte and copper layer 104, with electrons flowing from the point at the surface where oxygen is reduced, to islands 106 in via 16 which are preferentially corroded. The reducing component of this redox reaction is not limited to regions near islands 106 in via 16. In fact, field region 22 is the more likely source of the majority of the reduction reaction because field region 22 is better exposed to replenished oxygen from the flowing electrolyte (assuming that seed layer 20 has sufficient electrical conductivity to carry the electrons from field region 22 to islands 106). The half reactions of interest are:

$$O_2 + 4H^+ + 4e^- \rightarrow 2H_2O \quad E_0 = 1.229 \text{ V (vs Standard Hydrogen Electrode, "SHE")} \quad (1)$$

$$Cu^0 \rightarrow Cu^{+2} + 2e^- \quad E_0 = 0.342 \text{ V (vs SHE)} \quad (2)$$

$$2Cu + O_2 + 4H^+ \rightarrow 2Cu^{+2} + 2H_2O \quad E_0 = 0.887 \text{ V } (1m/1H^+ \text{ and } Cu^{+2}) \quad (3)$$

Thus, placing a substrate coated with seed layer 20 into the plating electrolyte under open circuit conditions results in copper etching (corrosion).

Copper etching is particular pronounced for islands 106 in via 16 (or other feature) which can be understood as a combination of two effects: 1) the relatively larger surface energy of curved islands compared to planar layers; and 2) the larger surface area of copper typically exposed to the electrolyte (per unit of substrate area) in regions rich in islands in comparison to planar regions. In particular, assuming a hemispherical island 106 (phase 1, copper in this embodiment) on a layer 102 (phase 2, tantalum in this embodiment) surrounded by a liquid (phase 3, electroplating solution in this embodiment), the total free energy of formation of the island 106 as a function of the island radius r, $\Delta G_f$, is $$\Delta G_f = \pi r^2 (2\sigma_{13} + \sigma_{12} - \sigma_{23}) + (2/3)\pi r^3 \Delta G_v \tag{4}$$

where $\sigma_{12}$, $\sigma C_{13}$, $\sigma_{23}$ are the surface energies (tensions) of the various interfaces, copper-tantalum, copper-solution, tantalum-solution respectively. $\Delta G_t$ is the volumetric free energy change associated with the formation of island 106 with respect to a given solution. If equation (4) is expressed on a molar basis, one obtains (in joules per mole of material of island 106):

$$[\Delta G_t/v_m] = \{[3(2\sigma_{13} + \sigma_{12} - \sigma_{23})]/(2rv_m)\} + \Delta G_v \tag{5}$$

where $v_m$ is the molar volume of copper.

From equation (5) one can readily derive the thermodynamic potential of formation of an island 106 with a particular radius r with respect to an infinitely large island ($r \to \infty$):

$$E(\infty) - E(r) = [(RT)/(nF)]\ln\{-\Delta G_t/v_m\} \tag{6}$$

$$= [(RT)/(nF)]\ln\{[[3(2\sigma_{13} + \sigma_{12} - \sigma_{23})]/(2rv_m)\}$$

Equation 6 illustrates that a significant potential difference exists between a particle having a small radius r and a planar surface of the same material. That is, a voltmeter connecting the two would show a significant voltage reading. Since islands 106 are electrically connected to copper layer 104 on field region 22, islands 106 tend to dissolve at the expense of forming the larger copper layer 104 on field region 22. Thus, upon being placed into the electroplating solution, copper layer 104 will tend to be etched and, more particularly, islands 106 of copper layer 104 will be preferentially etched relative to copper layer 104 on field region 22. This etching of copper on sidewalls 16S of via 16 further increases the electrical resistance leading to the bottom of trenches and vias, providing another impediment to distribution of electroplating current to the bottoms of features. This nucleation effect is depicted in FIG. 21. To prevent this growth of copper islands, a cathodic potential should be applied of sufficient magnitude to overcome the effects of Eq. (6).

Therefore, destruction or degradation of the relatively thin copper layer on sidewalls 16S of via 16 (and other features) is detrimental to achieving an effective electroplating process. In accordance with the present invention, copper layer 104 is preserved by cathodically polarizing seed layer 20 relative to the solution. In one embodiment, seed layer 20 is cathodically polarized by pre-setting a power supply to provide a small cathodic current typically in the range of about 0.1 to 5 mA/cm$^2$ which flows from the anode to seed layer 20 immediately upon the seed layer 20 contacting the electrolyte. The actual current value will depend on the plating solution, feature density, quality of seed layer and other conditions. In another embodiment, a slightly cathodic voltage (i.e. a negative voltage such as −10 mV) with respect to a reference electrode (for example, Cu wire in the electrolyte) is applied to seed layer 20 prior to seed layer 20 making contact with the electrolyte. The present invention demonstrates that substantial improvement in feature electroplating is achieved by these procedures.

Through the use of the entry phase described above, copper islands 106 and thin copper layer 104 tend to remain intact upon entry of the substrate into the electroplating bath. However, even if islands 106 are preserved, seed layer 20 may not have sufficient electrical conductivity to distribute electroplating current to bottom 16B of via 16 to achieve bottom-up filling. We note that this entry phase may not prevent oxidation of the tantalum layer since the oxidation may occur due to environmental conditions well before the electroplating process begins.

Figure 38:
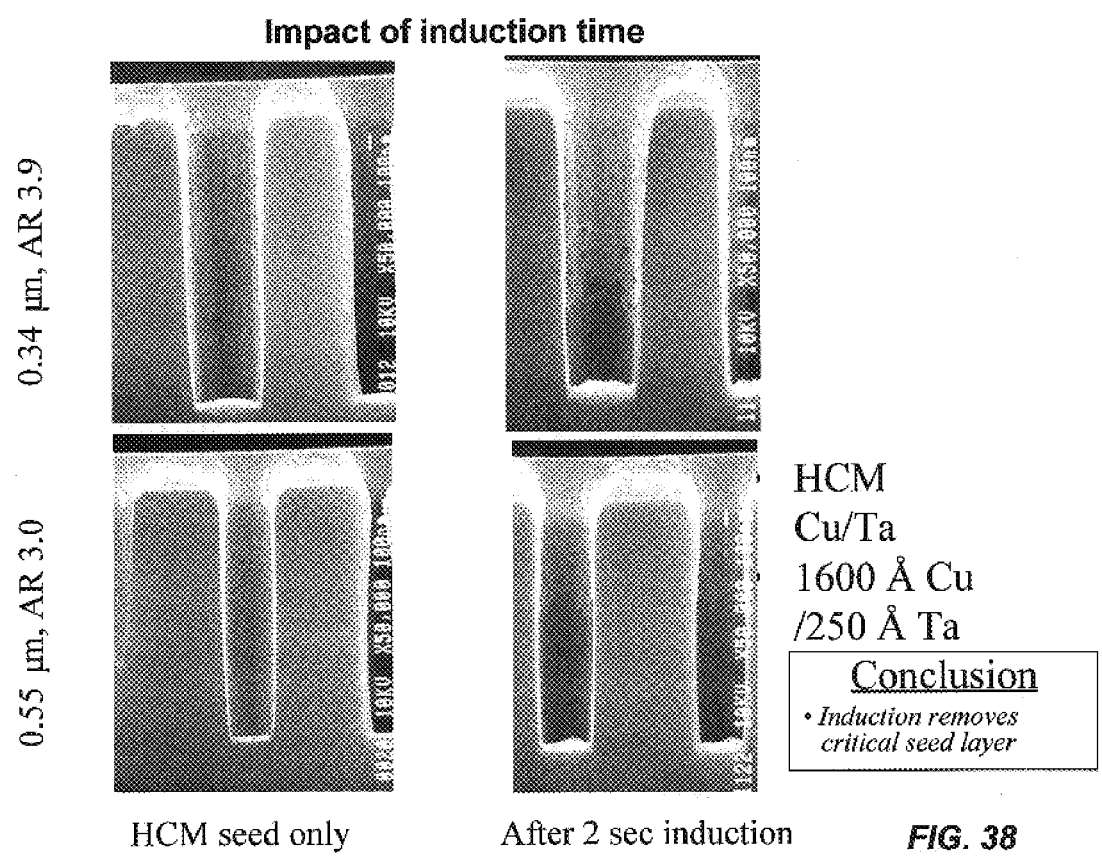
FIG. 38 depicts corrosion upon phase 1 (entry) of the wafer into the electroplating bath in which a time delay ("induction time") occurs before the cathodic polarization is introduced, as would be required to permit complete wetting of the wafer, for example. An induction period of as short as 2 seconds shows depletion of copper.
Figure 39:
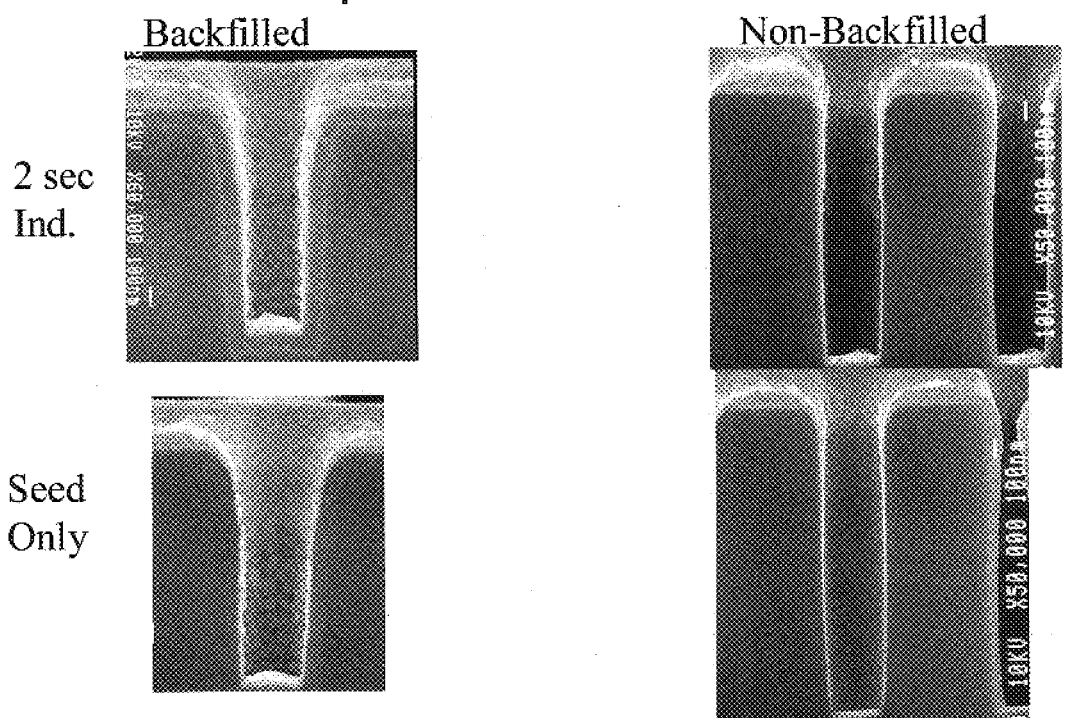
FIGS. 39 and 40 show the effect of conformally depositing another layer ("backfilled"), amorphous silicon in these figures to increase the aspect ratio. This is a technique to study the electroplating of smaller features when such features may not be reliably fabricated by present technology. Different magnifications are shown.
Figure 40:
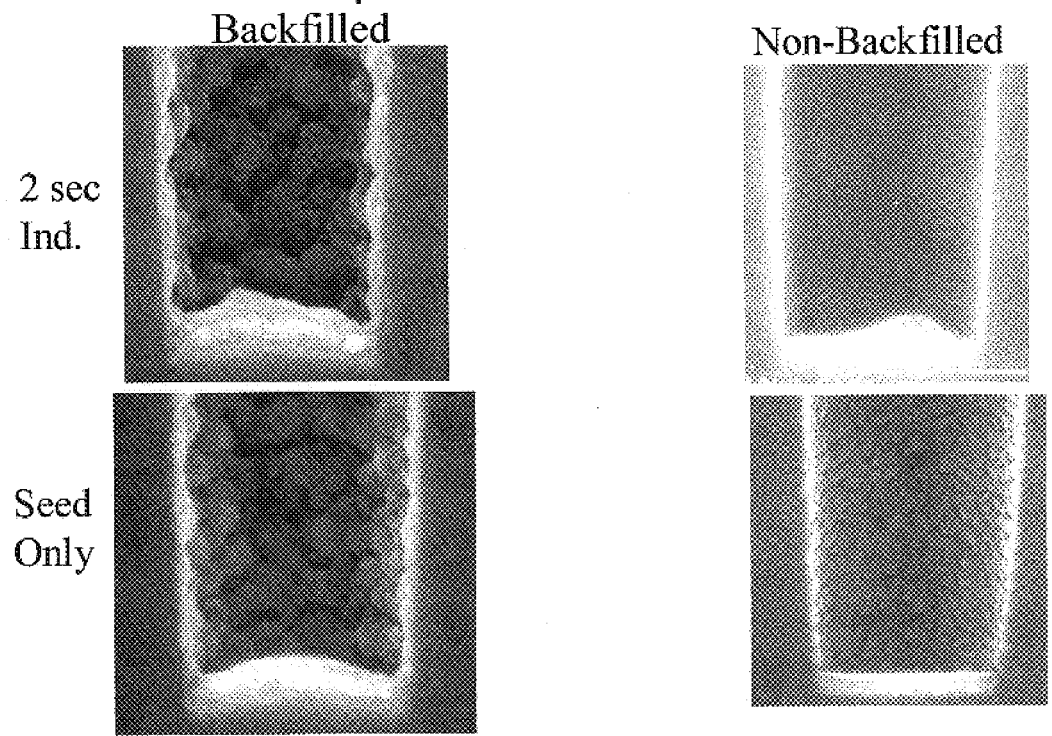

As noted, one embodiment of the process of phase 1 is to cathodically polarize the substrate prior to immersion in the plating bath. That is, as soon as the plating bath contacts the substrate, the cathodic polarization is in place and begins its effect. An alternative embodiment is to immerse the substrate unpolarized into the plating bath and, after a few seconds, apply cathodic polarization. It may be preferable in certain instances to permit the substrate to be fully wetted by the plating bath, bubbles dissipated, etc. before cathodic polarization is applied. The effects of such tests are given in FIGS. 38–40 waiting about 2 seconds before current is applied. As shown, a delay of as long as 2 seconds seems to cause loss of copper. Thus, any pause before application of cathodic polarization to the substrate needs to be quite short.

Depicted in FIGS. 47–52 is the effect of applying a cathodic polarization with a low current value then increasing to a higher current value. As shown in the figure, this two step current procedure (applied substantially contemporaneously with, or before, contacting the plating bath), leads to somewhat improved preservation of the copper. Thus, increasing current in time, perhaps in steps or ramping up, seems to better preserve the copper.

The above system makes use of two electrodes. The cathode, or working electrode, is the substrate to be plated. The second electrode, anode, or counter electrode in this case is a copper electrode, providing the source of plating copper as well as the second electrode. Other types of counter electrodes that do not supply copper can be used, such as Ti, Pt, etc. A third or reference electrode may optionally be included that carries no current. The reference electrode is typically used as a probe for measurement of voltage, or in controlled-potential processes. The phase 1 procedures discussed herein needs to be polarized negative with respect to the reference electrode (solution potential).

2. The Initiation Phase.

The purpose of the initiation phase is to nucleate and to grow a relatively thin conducting film in a conformal manner onto a relatively poor substrate surface (such as a surface with islands or a spotted film as depicted in FIG. 5).

Figure 37:
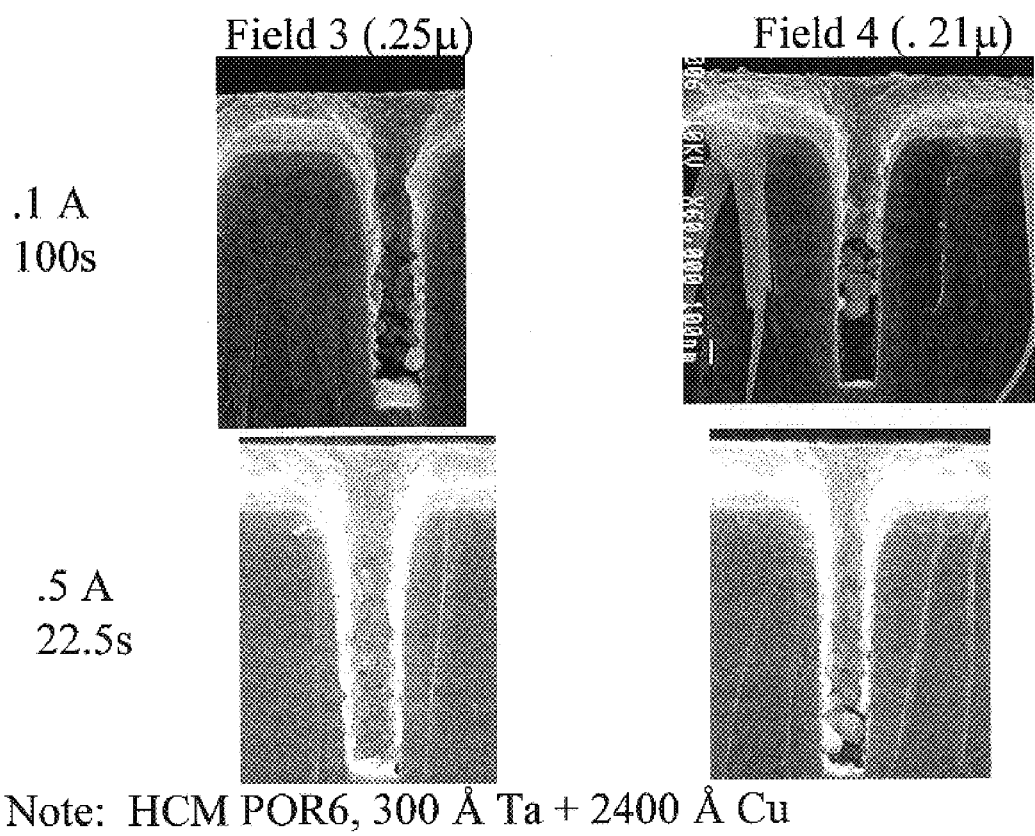
FIG. 37 gives examples of plating during initiation phase, phase 2, at various currents and for various times as shown. The features are vias of approximately 1 $\mu$m depth and width as noted in Field 3 and Field 4. The structure of the film is shown after initiation plating according to the specified conditions. 0.5 amp shows significantly more metal at the bottom of the via than 0.1 amp.
Figure 41:
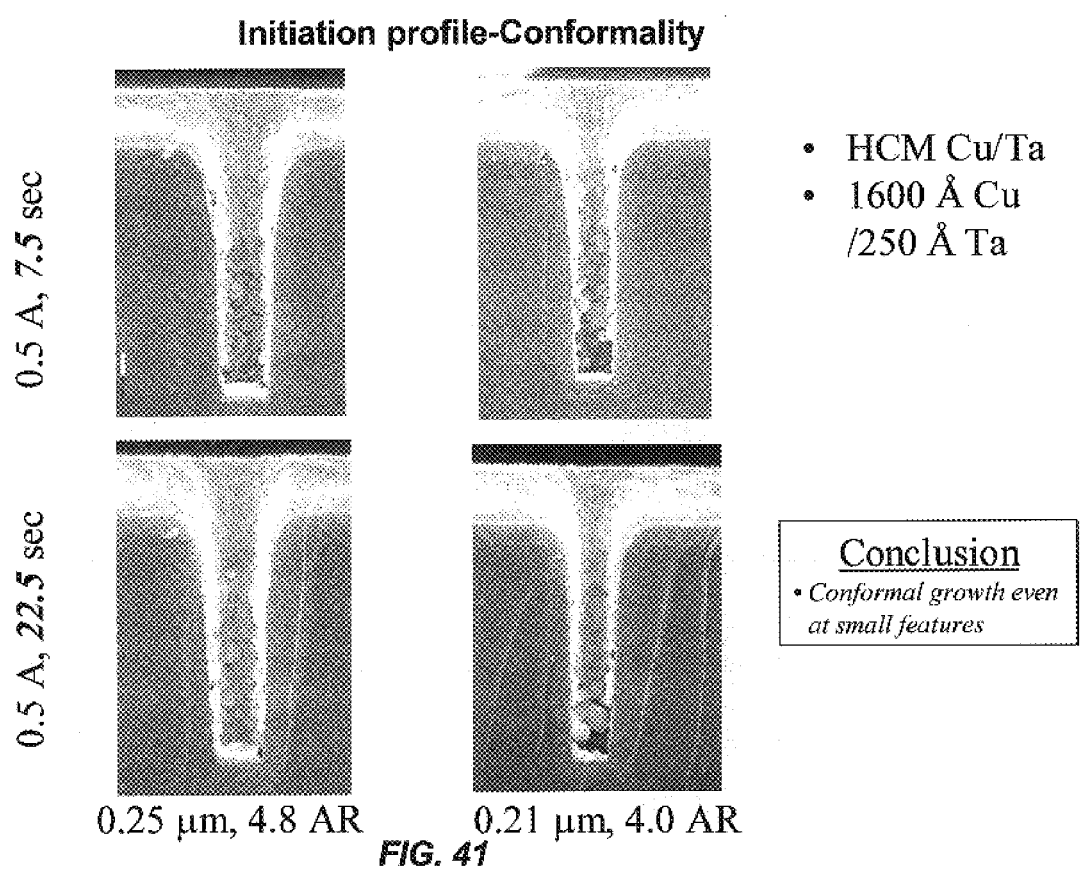
FIG. 41 shows the initiation phase plating (phase 2) using low currents such that the relative resistance of feature top and bottom is high in comparison with diffusion resistance. At low current, the relative resistance of surface reaction to diffusion is high. Thus, conformal plating occurs without substantial depletion effect (depletion of copper due to reaction occurring faster than diffusion to the reaction site). Slow plating rate favors conformal plating. Additionally, low plating current has a small additive depletion effect, further increasing conformality. Bottom-up filling does not occur at these low current levels, 0.5 amp.
Figure 43:
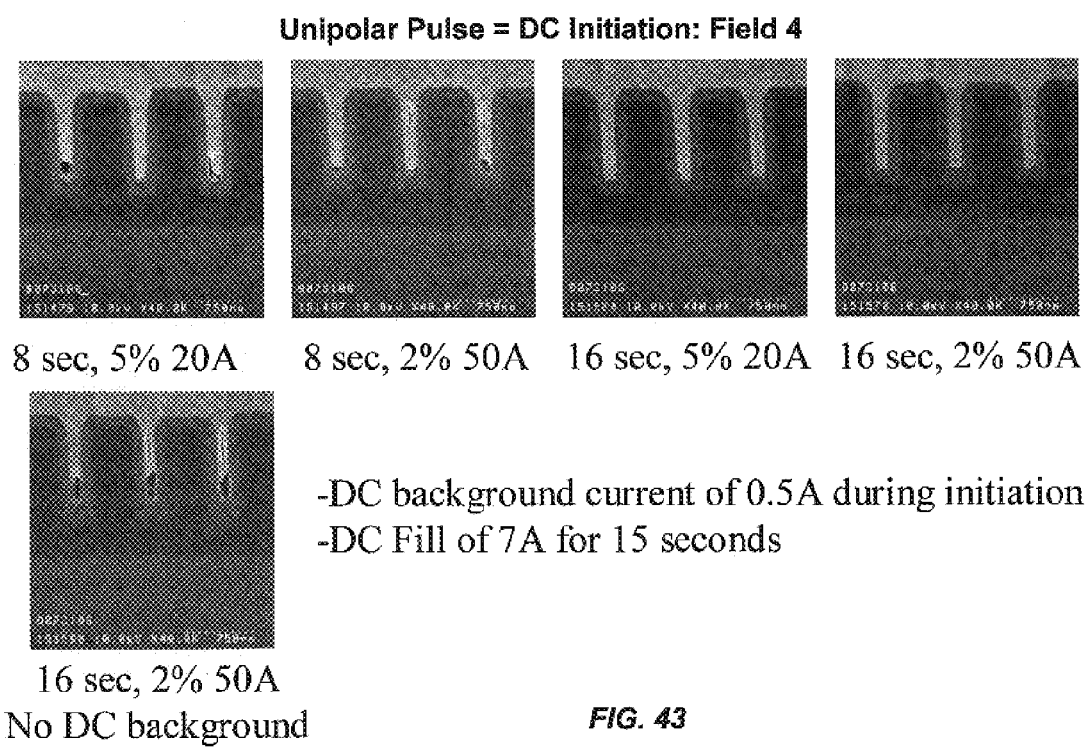
FIG. 43 relates to unipolar pulse conditions for the initiation phase, phase 2.
Figure 44:
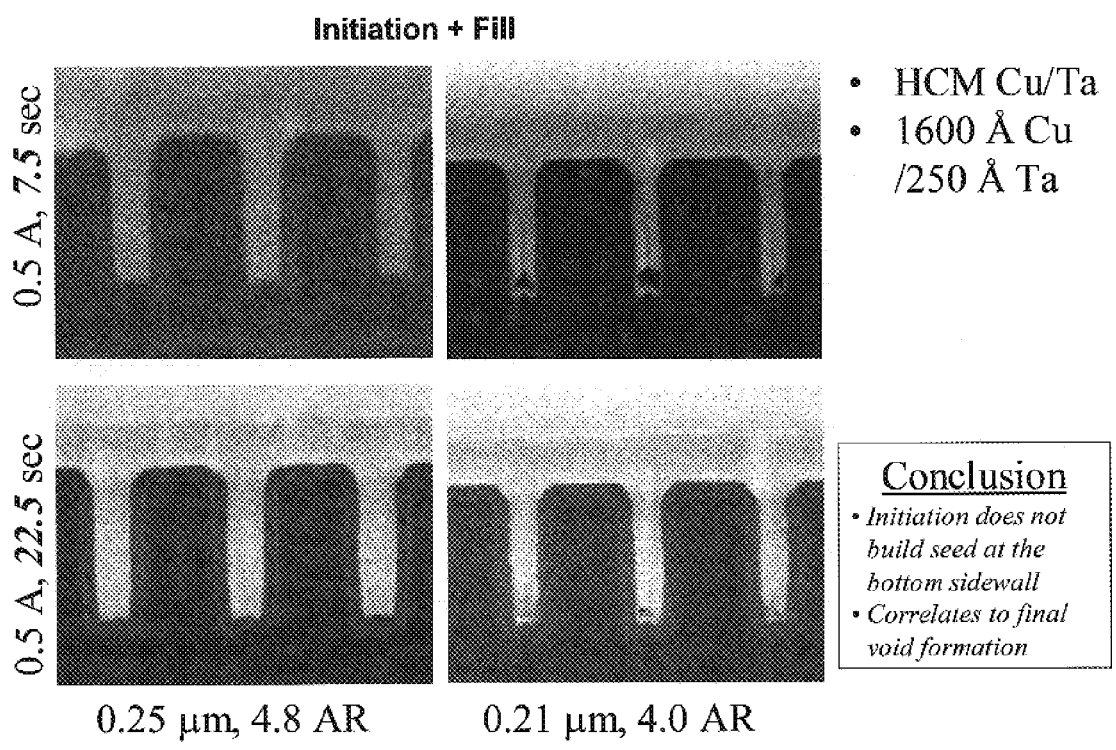
Figure 52:
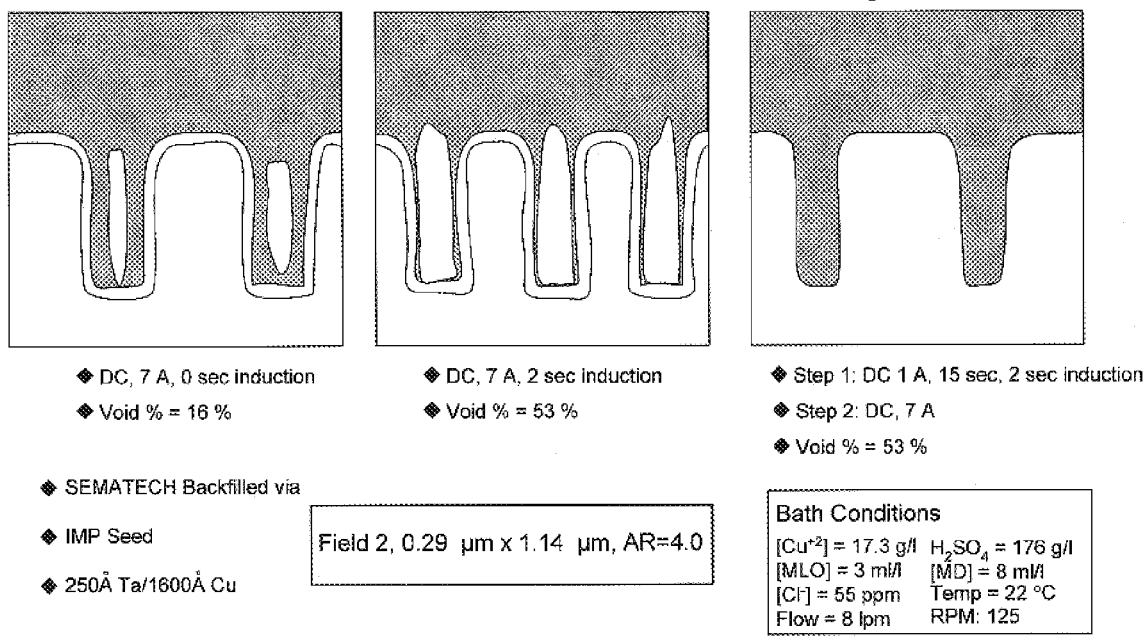
FIG. 52 shows various induction delays in applying current in phase 1, entry phase these figures depict that a low current initial stage is important although an induction delay prior to application of the first (low) current level is to be avoided.

FIGS. 37 and 41 depict the effects of low currents under conditions so the relative surface resistance of the upper and lower portions of the feature sidewall is high compared to the diffusion resistance. At low currents, the relative resistance of surface reaction is high, leading to conformal plating inside the feature. The rate of plating is sufficiently low at every position along the sidewall that there is no significant depletion effect anywhere. The depletion effect relates to copper diffusing to the surface at a rate slower than the copper reduction and plating on the surface, resulting in copper diffusion being the step limiting the rate of copper plating. However, the current is intentionally kept sufficiently low herein that the plating rate is small compared to the diffusion, leading to substantially conformal plating everywhere inside the feature.

In addition, at very low currents, suppression additives are not significantly depleted. Low current leading to slow plating (slow compared to the rate of diffusion of copper and additives to the surface) results in no preference for copper or suppression additives for either the top or the bottom of the feature. Thus, the effective resistance on the surface remains large and substantially constant everywhere, leading to conformal plating. Conformal plating permits increased currents to be delivered to the entire feature depth of the feature. Increasing the current at this stage leads to depletion of suppression additives preferentially at the bottom of the feature (where replenishment through diffusion is slower than near the top of the feature). Bottom-up filling is the result, described in more detail as phase 3. Examples of both conformal and bottom-up filling are given in the figures.

FIG. 6 is an enlarged view of the region 100 of FIG. 2 subsequent to the initiation phase in accordance with the present invention. As shown in FIG. 6, a conductor layer 110 has been formed on copper layer 104. Conductor layer 110, typically formed of the same electrically conductive material as layer 104, e.g. copper, has thickness sufficient to support electroplating current distribution to bottom 16B of via 16. Illustratively, conductor layer 110 will typically be relatively thin, having a thickness of up to about 500 Å (Angstroms).

Three procedures have been found by the inventors to perform adequately in this initiation phase. All three make use of additives typically used in electroplating solutions, commonly mercaptopropane sulfonic acid, dimercaptopropane sulfonic acid and the like that aid in the nucleation process (typically referred to as brighteners, nucleation catalysts or accelerators), and suppressors (such as polyethylene glycol, polyethylene oxide, polypropylene oxide, mixtures and co-polymers thereof).

In the first embodiment, conductor film 110 is formed by applying a low dc net cathodic current, illustratively in the range of 0.1 to 5 mcm². Using a relatively low dc net cathodic current allows additives in the electrolyte to adsorb onto the copper layer 104 from the bulk of the electrolyte solution. The additives are found not to be significantly depleted in the bulk solution by this process. Electroreduction causes the additives to be consumed at relatively low rates due to the relatively low current density applied, sufficiently low that additive replenishment by diffusion occurs. The additives adsorbed to copper layer 104 inhibit electroplating to those regions adsorbing additives, and thus tend to uniformly redistribute the electroplate material of conductor layer 110. The relatively low dc current is not sufficient to cause bottom-up filling (required in later phases) because, as described below, bottom-up filling requires additive depletion.

Without additives, conductor layer 110 would be preferentially deposited in certain regions, e.g. regions to which electroplating current is preferentially distributed. Certain additives tend to impede electroplating by adding a significant electrical resistance in series with other electrical resistance in the electrodeposition circuit. If this additive reated electrical resistance is sufficiently large, the deposition rate in regions of the surface having additives will be reduced in comparison with those regions lacking additives. Thus, the deposition rate can be equalized by a proper choice of additive leading to uniform (conformal) deposition rates. Conducting layer 110 can thus have a relatively uniform thickness. The relative concentration of nucleation additives (brighteners) can be adjusted with respect to other additives to improve the uniformity of conductor layer 110, but the use of low current is found to be the most effective method of achieving the desired uniformity (that is, currents sufficiently low to avoid additive depletion).

The second method for performing this initiation phase also involves the use of relatively small net dc cathodic currents (typically 0.1 to 5 mA/cm²) onto which are superimposed short cathodic current pulses in the range of 25 to 250 mA/cm² with pulse lengths in the range of 0.5 to 10 ms at a relatively low duty cycle in the range of 0.2 to 10%. These superimposed pulses aid in the formation between islands that are subsequently grown to fill the gaps during the low-current (pulse off) portion of the duty cycle.

A third approach involves use of small, net dc cathodic current onto which, is superimposed an alternating cathodic and anodic current pulse or wave at a moderate duty cycle. For example, an applied low dc net cathodic current in the range of 0.1 to 5 mA/cm² onto which are superimposed alternating cathodic and anodic current pulses in the range of 25 to 250 mA/cm² with pulse lengths in the range of 0.5 to 10 ms at a moderate duty cycle in the range of 10 to 50%. It is believed that superimposing an alternating cathodic and anodic current pulse may enhance formation of conductor film 110 better than superimposing only a cathodic current pulse in some instances, perhaps by enhancing film activation.

Conductor film 110 is also formed on copper layer 104 on field region 22. Accordingly, conductor film 110 reduces the electrical resistance from the edge of substrate 10 to the various features on substrate 10. (The electrical interconnection between substrate 10 and the electroplating apparatus is typically established at the edge of substrate 10.)

3. The Bottom-up Filling Phase

Highest AR features are the most constricted and fill first in time because these features most quickly in time become depleted of additives. Additive depletion increases the plating rate, leading to preferential filling of higher AR features in which diffusion of suppression additives to the bottom of the feature is slowest. For a given fixed current density, higher AR features lead to depletion most quickly and plating starts to accelerate earlier in time. Very small aspect ratio features require a higher current to lead to bottom-up filling, because they are less restrictive to diffusion of suppression additives to the plating site. Very low AR features plate conformally throughout. Preferably, the current for bottom-up filling should begin low to plate preferentially the bottoms of the largest AR features. Ramping up the current leads to plating of smaller AR features in the bottom-up mode as higher rates of additive diffusion are required to "keep up" with the higher plating brought about by increasing current.

Substrates to be electroplated according to the present invention will generally have both high and low AR features. The primary focus of the present invention is directed towards overcoming the particular problems occurring in electroplating high AR features. Nevertheless, in plating high AR features, the present invention typically does so in a manner so as to permit subsequent electroplating of low AR features in an efficient manner without seams or voids. Additionally, the present invention as practiced on high AR features typically involves filling-such features from the bottom-up. Thus, as the depth of the feature decreases faster than the width, the AR necessarily also decreases reducing high AR features to low AR features as electroplating proceeds. This bottom-up filling phase is thus directed at preferentially depositing conductor on the bottoms of high AR features. The fourth and final electroplating phase completes the seamless/voidless electroplating of low AR features which, at the beginning of this fourth phase, includes all features, including formerly high AR features now having low ARs.

This bottom-up filling phase makes use of plating additive mixtures to achieve a high degree of "redistribution power" (that is, preferentially directing electroplating to small regions and recesses generally inaccessible to the plating electric field and to bulk solution materials). It is believed that some of these additives are consumed (reduced) as a necessary side reaction to the main copper deposition process. There is also evidence for the interaction between such organic additive species. Whatever the precise mechanism of interaction, the present invention makes use of depletion and diffusion-limited replenishment to deposit copper selectively on the bottoms of high AR features.

The bottom-up filling phase essentially makes use of preferential deposition of copper on surfaces that may be lacking suppressive additives (or concentrating additive breakdown products that may act as catalysts) in the immediate region. Thus, diffusion through the electrolyte determines the rate at which additives arrive at the surface (or breakdown products can be removed) while the current flow determines how rapidly the additives are consumed. For bottom-up filling of high AR features, the phase commences with reasonably low currents. Thus, the bottoms of the most diffusion-constrained features (highest ARs) will be the only regions substantially lacking such additives and, thus, the only regions significantly receiving deposited copper. As such regions fill, less diffusion-constrained regions require electroplating. This is achieved in the present invention by increasing the current flow such that additive depletion occurs in the most diffusion-limited regions (still bottoms of features) although less diffusion-constrained than the bottoms of higher AR features (now partially filled). Thus, the essential operation of the bottom-up filling phase involves the following steps: Selecting additives, electrolyte conditions and current flows such that only the most diffusion-limited regions at the bottoms of the highest AR features receive substantial electroplating in stepwise or continuous manner. Increasing the current flow continuously, thereby electroplating progressively less diffusion-limited regions of features. Finally, only low AR features remain for electroplating, leading to the fourth and final phase. Specific embodiments follow.

Figure 7:
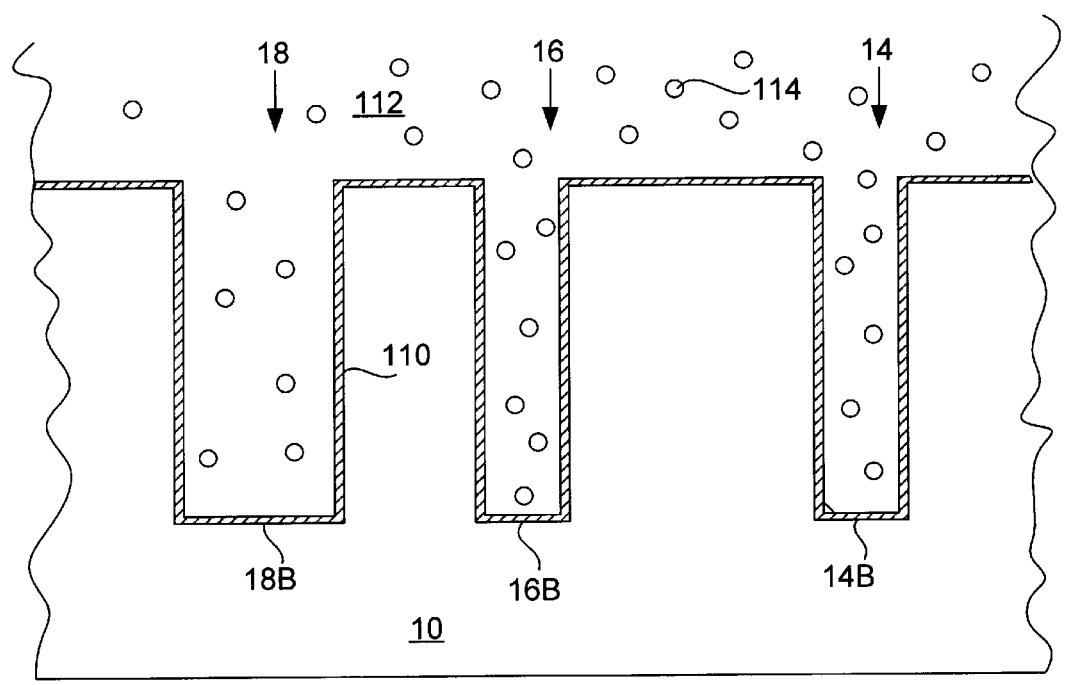
FIG. 7 is a cross-sectional view of substrate 10 along the line II—II of FIG. 1 after the initiation phase of the present invention.

FIG. 7 is a cross-sectional view of substrate 10 along the line II—II of FIG. 1 after the initiation phase in accordance with the present invention. As shown in FIG. 7, conductor layer 110 now covers field region 22 and lines trench 14, vias 16, 18. (Although only conductor layer 110 is labeled and illustrated in the subsequent figures for purposes of clarity, it is understood that seed layer 20 underlies conductor layer 110.) As set forth above, conductor layer 110 has a thickness and electrical conductivity sufficient to distribute electroplating current to bottoms 14B, 16B, 18B of trench 14, vias 16, 18, respectively.

Figure 4:
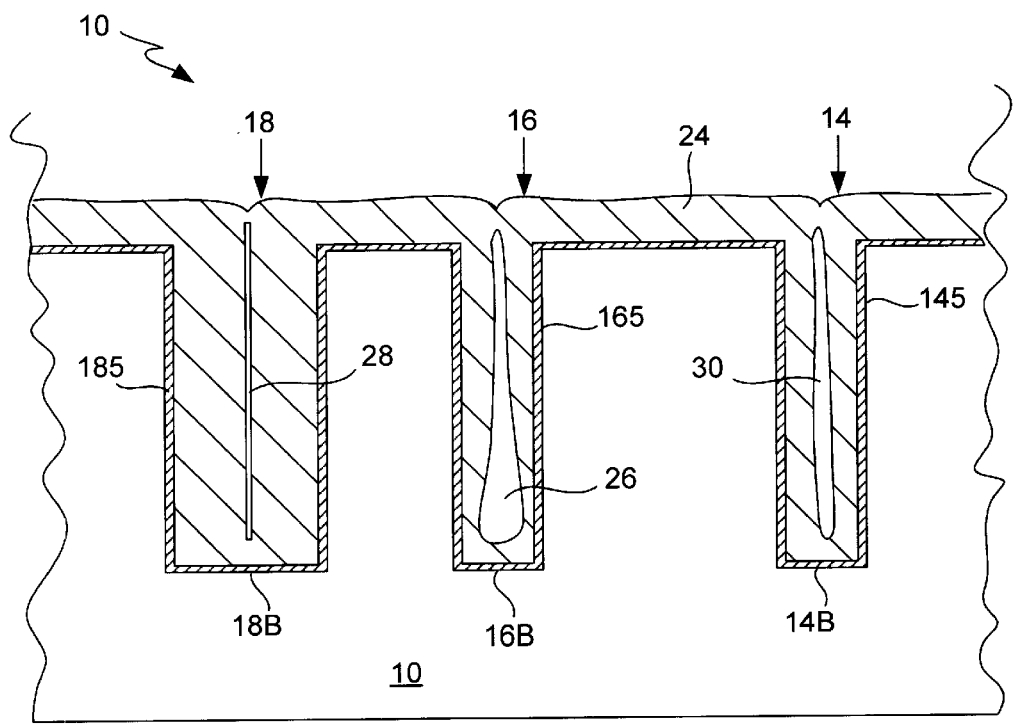
FIG. 4 is a cross-sectional view of the substrate along the line II—II of FIG. 1 after electroplating.

At this point, if a relatively high electroplating current were applied to conductor layer 110, voids and seams in trench 14, via 16, 18 similar to conventional seams 28, 30 and void 26 as illustrated in FIG. 4 are likely to result. That is, this is thought to be due to the fact that additives contained in the electroplating solution within the features would deplete over much of the feature wall and bottom surface in the presence of high currents, and, due to the constrained flow in the features, not be promptly replenished. This depletion would negate the leveling effect of the additives on the deposition of metal resulting in deposition of the electroplated material at the same rate on the feature bottom as the feature sidewall. Since the features are much deeper than wide, seams or voids would tend to be formed as the walls constrict the lateral extent of the feature more rapidly than it fills. Further, diffusion limitations of the ions of material to be electroplated cause the electroplated material to be preferentially deposited in the features nearer to the field region 22 rather than closer to the bottom of the feature, thus enhancing formation of seams and voids. Avoidance of seams and voids is a primary feature of the present invention, negated in this phase if relatively high currents are used.

To avoid seam and void formation, the features are preferentially filled from the bottom-up. Referring again to FIG. 7, to effect bottom-up filling, substrate 10 is immersed in an electroplating solution 112 or more typically remains in solution 112 from the previous initiation phase. Solution 112 contains electroplating additives 114 such as mercaptopropane sulfonic acid(MPS), dimercaptopropane sulfonic acid (SPS), N-N dimethyl dithiocarbamic acid-3-sulfopropyl-ester (DPS), polyethylene glycol and/or polypropylene glycol. Commercial products such as Enthone™ (OMI, Inc., New Haven, Conn.), Cu-Bath-SC™ and Cu-Bath-N™, Shipley Ronal (Marlborough Mass.), Copper Ultrafill™, to mention just a few, may also be usefully employed in the practice of the present invention. Only a single additive 114 is labeled for purposes of clarity. However, additives can be used singly or in combination as a mixture of distinct chemical species. At this point in the process of the present invention, additives 114 are essentially uniformly distributed in solution 112 and in trench 14, vias 16, 18.

Figure 8:
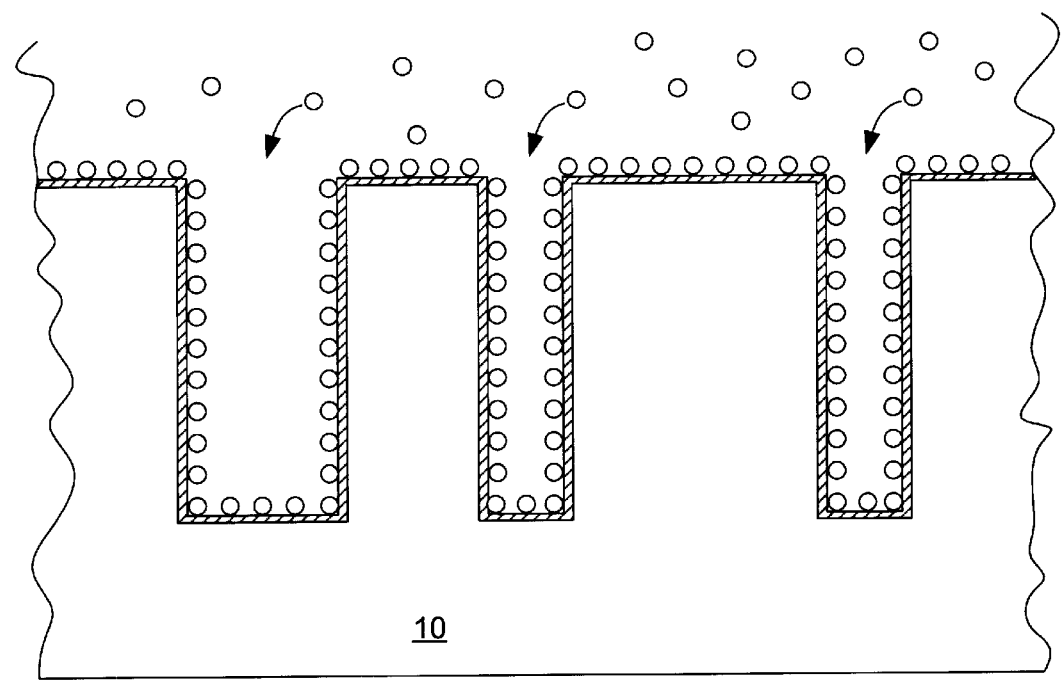
FIG. 8 is the cross-sectional view of FIG. 7 during the early stages of the bottom-up filling phase of the present invention.

FIG. 8 depicts the cross-sectional view of FIG. 7 during the initial stage of a bottom-up filling phase in accordance with the present invention. Referring now to FIG. 8, there is initially a time for adsorption of additives to occur before an initial electroplating current is applied to conductor layer 110. Following this finite transition after the part is placed into the plating solution, electroplating current is applied. For example, a dc current in the range of approximately 1 to 300 mA/cm$^2$ may be applied to conductor layer 110.

Of importance, at essentially all expected concentrations of additive 114, e.g. between 20 to 300 ppm contained in the initial solution, there is insufficient additive 114 stored in via 16 to lead to substantial surface absorption of additive 114 on conductor layer 110 in via 16. By "substantial surface absorption" we intend the formation of a monolayer of additive 114 on conductor layer 110. Thus, additive 114 must diffuse from the bulk of solution 112 and into via 16 to allow substantial surface absorption of additive 114 on conductor layer 110 in via 16 since a boundary layer typically separates the substrate from the bulk of the solution and the concentration of various species in the bulk of the solution is substantially unaffected during the electroplating process. The diffusion of additives 114 from the bulk of solution 112 into via 16 takes a significant amount of time, e.g. on the order of seconds.

Figure 9:
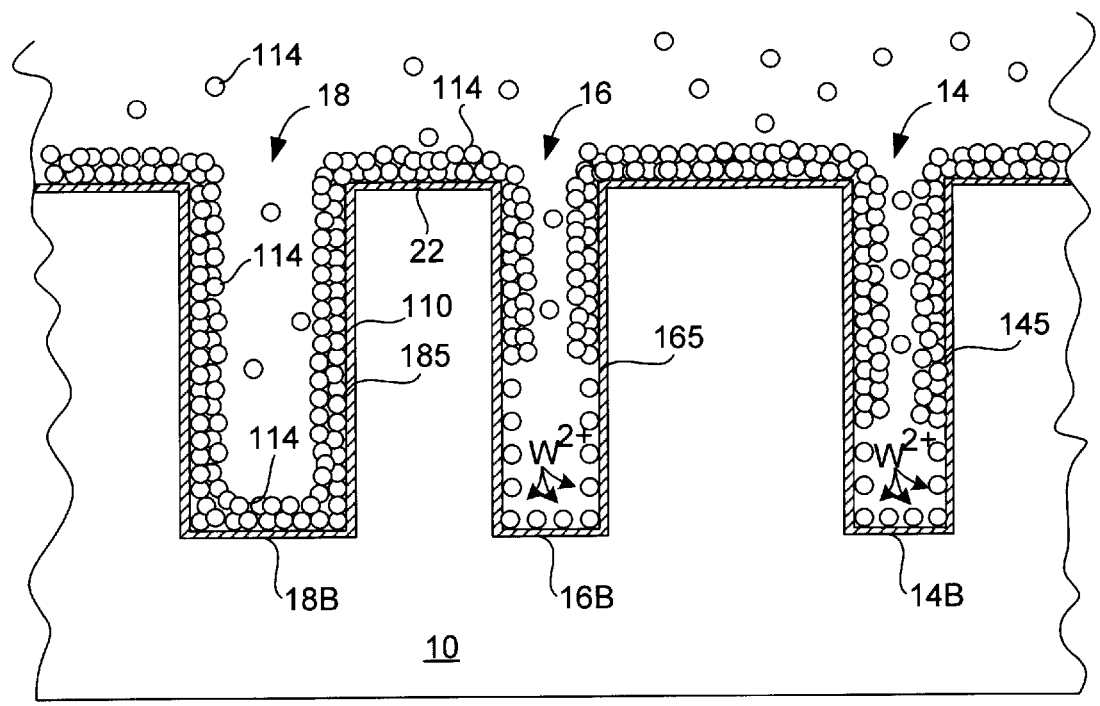
FIG. 9 is the cross-sectional view of FIG. 8 at a later time in the bottom-up filling phase of the present invention than the depiction of FIG. 8.

FIG. 9 is the cross-sectional view of FIG. 8 further along in the bottom-up filling phase in accordance with the present invention. As shown in FIG. 9, a significant amount of additive 114 has adsorbed on sidewalls 18S and bottom 18B of via 18. As alluded to above in the initiation phase discussion, adsorbed additives tend to inhibit electroplating. In the case when copper is to be electroplated, the significant amount of additive 114 adsorbed on conductor layer 110 in via 18 prevents any appreciable copper deposition in via 18.

In the absence of current, the additive materials will eventually be adsorbed essentially everywhere. One approximate model is that the additive is consumed by incorporation into the surface or conversion into another compound at the surface. The applied current essentially establishes a unique potential in the metal phase (everywhere along the surface and in the trench). The rate of local consumption of additive is a function both of electrical potential and accessibility of species to the surface by diffusion (diffusion accessibility). In recessed regions, diffusion is relatively poor causing the additive to be replaced at a slower rate than it is consumed. Thus, in such additive-poor regions there is little current suppressing effect and a resulting high current.

According to one model, it is believed that additives 114 are consumed, e.g. reduced, during electroplating. In particular, it is believed that additives 114 are consumed as a necessary side reaction to the electroplated copper deposition reaction. The additive 114 consumed must be replenished by diffusion of additive 114 from the bulk of solution 112. As shown in FIG. 9, additive 114 diffuses into via 16 and replenishes any additive 114 consumed in via 16 near field region 22. However, there is insufficient diffusion of additive 114 into bottom 16B of via 16 to replenish additive 114 consumed on and near bottom 16B. Diffusion of additive 114 to or near bottom 16B of via 16 is limited due to the relatively high AR of via 16. This phenomenon can be contrasted to that observed in via 18 which has a low enough AR to allow any additive 114 consumed in via 18 to be readily replenished from the bulk of solution 112.

Since additive 114 is substantially depleted near bottom 16B of via 16, copper is deposited on bottom 16B and sidewalls 16S adjacent bottom 16B. Thus, copper begins to fill via 16 from bottom 16B. Further, since any additive 114 consumed in via 16 near field region 22 is readily replenished from the bulk of solution 112, significant deposition of copper on sidewalls 16S near field region 22 does not occur. The net result is that copper fills via 16 from bottom 16B and up. This is the so called "bottom-up filling" in accordance with the present invention.

The surface concentration profile of additive 114 in any feature depends on several factors such as the additive absorption time, flow conditions, local current distribution, film resistance, etc. However, to a large extent, the surface concentration profile depends primarily on the AR of the feature. To illustrate, assuming that trench 14 has the same AR as via 16, trench 14 also shall experience bottom-up filling but possibly to a lesser extent since additive 114 is depleted on the entire circumference 16S of via 16 but only on two sidewalls 14S of trench 14, a ratio of 4/2 for square vias or π/2 for cylindrical vias, favoring depletion in vias in both cases. Thus, as shown in FIG. 9, the optimal set of conditions for bottom-up filling often varies depending upon the particular feature. Further, over time, as via 16 is filled from bottom 16B up, the effective AR of via 16 decreases. Eventually, assuming a net current, additive depletion in via 16 would be readily replenished thus decreasing or eliminating the bottom-up filling selectivity.

Figure 10:
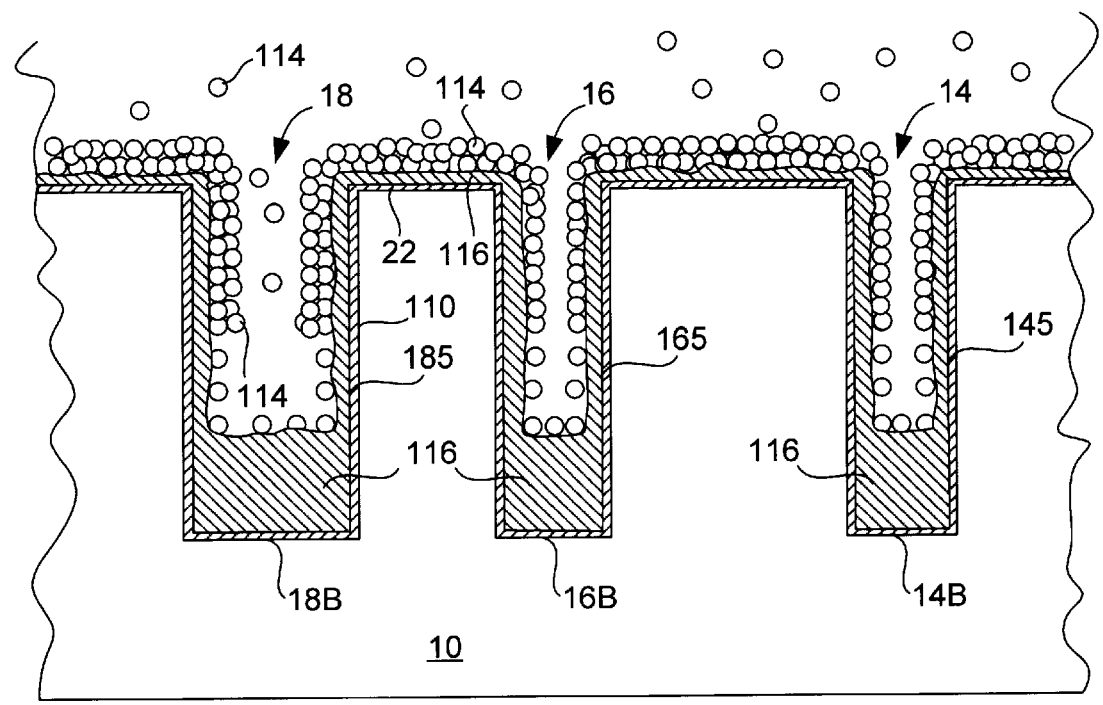
FIG. 10 is the cross-sectional view of FIG. 9 at a later time in the bottom-up filling phase of the present invention than the depiction of FIG. 9.

FIG. 10 is the cross-sectional view of FIG. 9 further along in the bottom-up filling phase in accordance with the present invention. As set forth above, if the bottom-up filling electroplating current was maintained at its initial value, bottom-up filling selectivity would begin to diminish for low AR features such as the now partially filled via 16 and trench 14. To maintain bottom-up filling selectivity for low AR features (or to obtain bottom-up filling selectivity for low AR features previously lacking such selectivity such as via 18), the electroplating current is increased. Illustratively, the bottom-up filling phase is initiated with a dc current in the approximate range of 0.0 to 5.0 mA/cm² and increased over a period in the range of 3 to 60 seconds to a maximum dc current in the approximate range of 4 to 45 mA/cm².

Referring to FIG. 10, as the electroplating current is increased, the electroplated copper deposition rate increases as does the rate of consumption of additive 114. Consequently, diffusion of additive into via 18, which was previously sufficient to readily replenish any additive 114 consumed in via 18, now becomes insufficient to replenish depletion of additive 114 near bottom 18B of via 18. Since additive 114 is substantially depleted near bottom 18B, copper is deposited on bottom 18B and sidewalls 18S adjacent bottom 16B. Thus, copper now begins to fill via 18 from bottom 18B. Further, since any additive 114 consumed in via 18 near field region 22 is readily replenished from the bulk of solution 112, significant deposition of copper on sidewalls 18S near field region 22 does not occur. The net result is that copper fills via 18 from bottom 18B and up. Trench 14, via 16, which now have lower ARs, also continue to fill from bottoms 18B, 16B, respectively, for similar reasons. Thus, by increasing the bottom-up filling electroplating current over time, optimal bottom-up filling results regardless of the characteristics (e.g. AR) of the feature.

Figure 11:
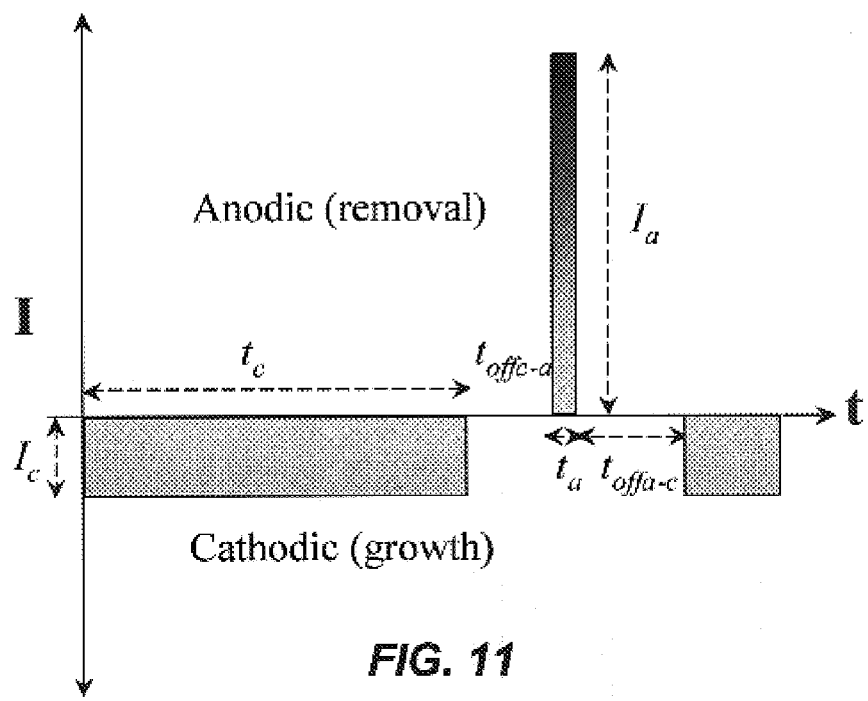
FIG. 11 depicts a typical cathodic-anodic-cathodic current duty cycle for the bottom-up filling phase according to the present invention.
Figure 12:
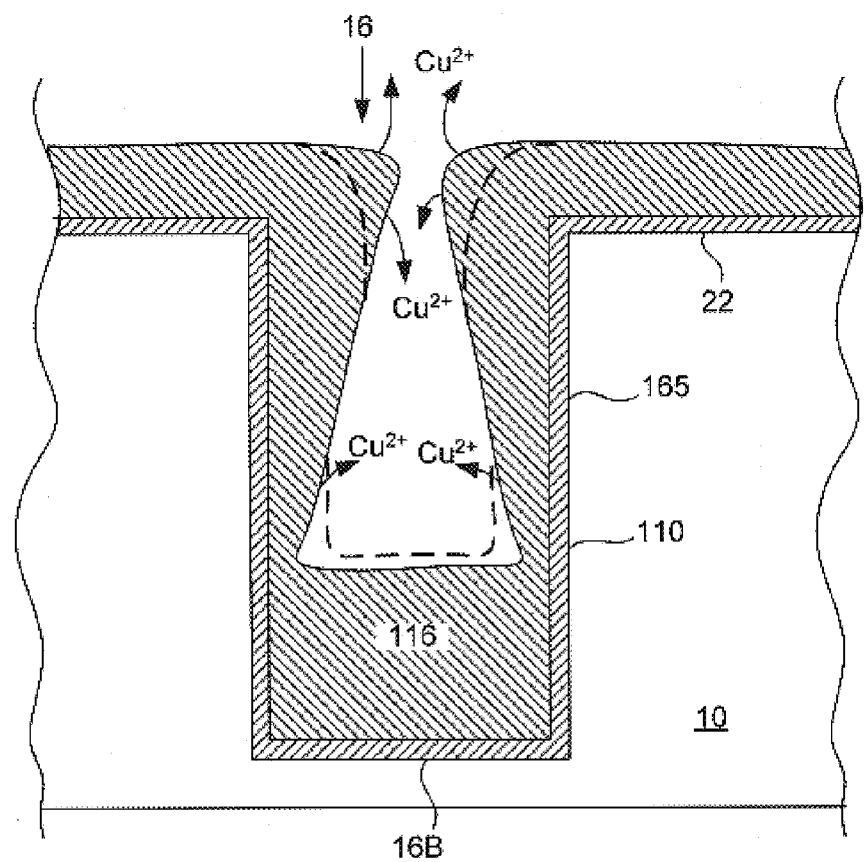
FIG. 12 is an enlarged view of FIG. 9 depicting redistribution of material as facilitated by the reversal of electroplating current.
Figure 13:
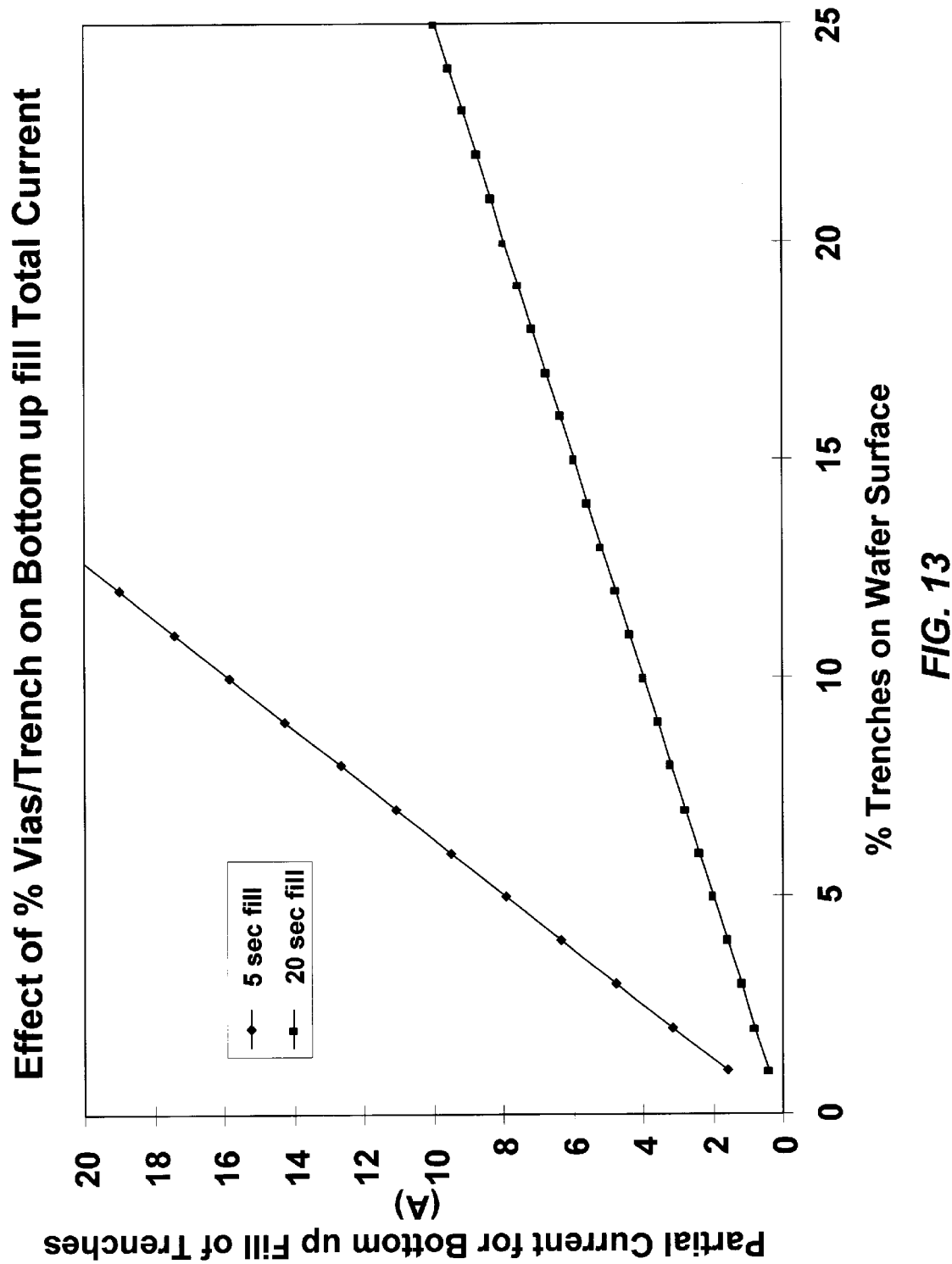
FIG. 13 depicts the increased current required for bottom-up filling as the percentage of wafer surface occupied by trenches increases for specified process times.
Figure 14:
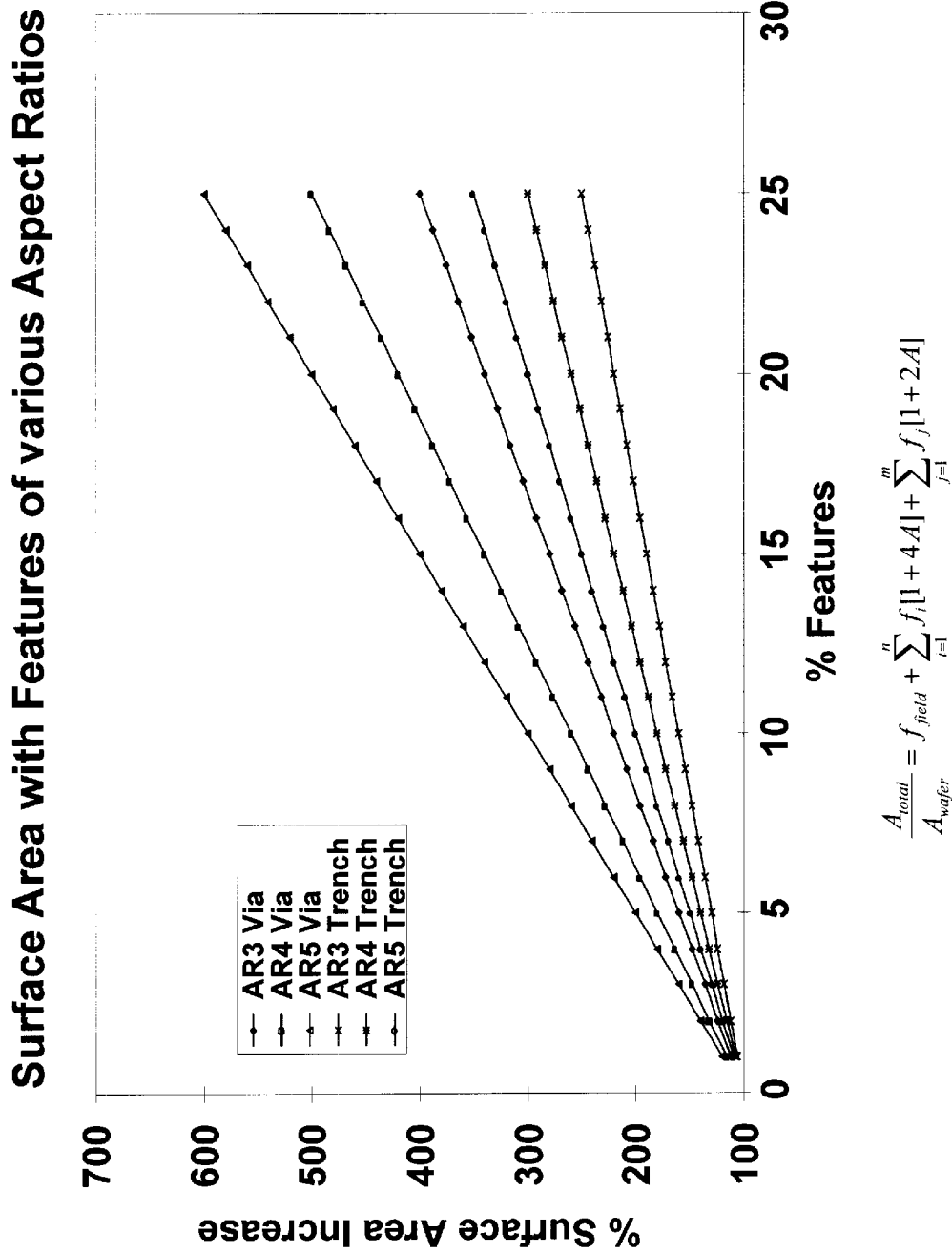
FIG. 14 depicts the % surface area increase as a function of the % features for various feature aspect ratios ("AR").

In certain cases where features are particularly difficult to fill such as features having extremely high ARs or bottle-necks, the application of anodic pulses during the bottom-up filling phase avoids seam and void formation. FIG. 11 is a graph of current versus time for an illustrative bipolar pulse plating waveform in accordance with the present invention. FIG. 12 is a cross-sectional view of via 16 of FIG. 10 illustrating the redistribution of electroplated layer 116 using the bipolar pulse plating waveform depicted in FIG. 11.

Referring to both FIGS. 11 and 12, initially a cathodic current $I_c$ is applied to conductor layer 110 for a time period $t_c$. Illustratively, cathodic current $I_c$ can be in the range of 3 to 45 mA/cm² and time period $t_c$ can be in the range of 1 to 200 msec. In one particular embodiment, cathodic current $I_c$ is 15 mA/cm² and time period $t_c$ is 100 msec. Multiple cathodic pulses with off times and multiple anodic pulses with off times can also be used, depending on the desired grain structure, growth rates and bottom-to-top selectivity desired. During the application of the cathodic current $I_c$, via 16 is filled selectively from bottom 16B as discussed above.

Following application of cathodic current $I_c$, no current is applied during an off-time period $t_{off c-a}$ during which relaxation and replenishment of additive 114 and copper ions in via 16 occurs (additives 114 are not shown in FIG. 12 for purposes of clarity).

An anodic current $I_a$ is then applied to conductor layer 110 for a time period $t_a$. It is believed that time period $t_a$ should be sufficient to establish diffusion-controlled conditions of additive within the feature during the anodic pulse and that, on the subsequent cathodic pulse, sufficient time is allowed for the re-establishment of diffusion limited transfer of additives to the bottom of the feature. The anodic current pulse as depicted in FIG. 11 preferentially removes copper from the upper portion of feature walls. Thus, a plating waveform of the type depicted in FIG. 11 includes a portion (the anodic portion) tending to compensate for preferential plating on the upper portions of the sidewalls by preferentially deplating metal for the same region. Numerous waveforms similar to that depicted in FIG. 11 may be employed. The reverse pulse waveform needs to be high enough so that substantial diffusion, back-resistance inside the trench occurs. The length of the pulse is determined by longer than about 10 msec. The relation to charges carried in the forward and reverse pulses needs to be greater than 1 to result in net plating (not de-plating).Thus, the negative area under the curve in FIG. 11 needs to exceed the positive area. FIGS. 22–36, 41–46 are examples of filling with various anodic pulses under conditions depicted on the figures and described in the description of figures.

4. Low AR Filling Phase

In addition to previously high AR features (now partially filled) very small AR features may occur on integrated circuits ("pads"). For example, a feature requiring metal filling may be 1:50 depth to width. Such gaping features will not have been significantly affected by the preceding electroplating steps. However, it is the function of this fourth phase to fill such features as well as finish the filling of those features whose filling has begun in previous phases. In these very small AR features, the metal must be plated to a level that the metal rises to a level higher than the field oxide layer. In essence, the thickness of the metal electrodeposited must exceed the depth of the pad such that, upon subsequent planarization, the metal remains above the pad to the desired thickness. In terms of processing speed, this pad filling process is the most time consuming. For rough qualitative estimates, phase 1 is of the order of a few seconds. Phase 2 is of the order of 10–20 seconds. Phase 3 is of the order of 30 seconds. And the pad (or "bulk") fill, phase 4, is of the order of 90 seconds. Thus, since overall process time is a consideration, performing the bulk fill as rapidly as possible is advantageous.

Once essentially all of the vias and trenches having high ARs have been filled, features with low AR (typically less than about 0.5) need to be filled. This generally is done by substantially conformal filling since the electroplating process is typically governed by electric field and diffusion dependent mechanisms during which additive depletion or side wall closure is not likely. Therefore, a layer of metal approximately equal to the dielectric layer in thickness is generally deposited (typically between 0.7 and 1.4 $\mu$m). Use of high currents increases the throughput of the process so long as the currents are not so high as to lead to significant reduction in anode service life or to additive maintenance/degradation. Also, compensation for non-uniformity arising from field shaping, wafer holder design, shielding, etc. is typically done at this phase of the electroplating process. Typical plating rates range from 15 to 75 mA/cm2, more typically from 20 to 50 mA/cm2, and most typically 25–40 mA/cm2. Metal deposited during this phase of the process is commonly removed in part in a subsequent metal planarization step.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A method of mitigating corrosion of a metal seed layer on the surface of recessed features caused by contact of said metal seed layer with an electroplating solution, the metal seed layer being formed at least in pall from copper, said method comprising cathodically polarizing said metal seed layer with respect to said solution prior to or less than approximately 5 seconds following contact of said metal seed layer with said solution, wherein said cathodic polarization of said metal seed layer is performed by applying a net cathodic voltage to said metal seed layer with respect to a copper reference electrode in the electroplating solution prior to said metal seed layer contacting said electroplating solution.

2. A method of mitigating corrosion as in claim 1 wherein said voltage is approximately −10 millivolts with respect to said reference copper electrode in said electroplating solution.

3. A method of electroplating a metal onto a surface comprising a field region and a plurality of recessed features having relatively higher and lower aspect ratios, the surface having a metal seed layer, the method comprising:

contacting said surface with an electroplating solution comprising metal ions and an additive under conditions wherein the metal seed layer is cathodically polarize with respect to the electroplating solution prior to or less than approximately 5 seconds following said contacting;

applying a dc cathodic current through said surface, the dc cathodic current having a first current density that is sufficiently small that depletion of metal ions and the additive is absent at both the field region and the recessed features, to create a substantially conformal thin conductive metal film on said surface;

contacting said thin conductive metal film on said surface with said electroplating solution for a time sufficient for adsorption of said additive onto said thin conductive metal film;

applying a dc cathodic current having a second value of current density through said surface, the second value such that electroplating occurs preferentially on bottoms of recessed features having the least diffusion-accessibility;

increasing said current density from said second value to a third value such that electroplating progresses to bottoms of features having higher diffusion-accessibility, until the aspect ratios of all of said recessed features are less than approximately 0.5; and further increasing said current density to a fourth value providing a condition of conformal plating, filling said recessed features.

4. A method of electroplating as in claim 3 wherein said metal ions comprise copper ions.

5. A method of electroplating as in claim 4 wherein said conformal thin conductive metal film on said surface has a thickness of about 500 Angstroms or less.

6. A method of electroplating as in claim 4 wherein said first current density is in the range from approximately 0.1 milliamperes per square centimeter to approximately 5 milliamperes per square centimeter.

7. A method of electroplating as in claim 6 wherein cathodic current pulses are superimposed on said first current density.

8. A method of electroplating as in claim 4 wherein said second value of current density is up to about 5 milliamperes per square centimeter and increasing said current density from said second value is increasing said current density over a period of from about 3 to about 60 seconds to a maximum current density of from about 4 to about 45 milliamperes per square centimeter.

9. A method of electroplating as in claim 4 wherein said fourth value of current density is from about 15 to about 75 milliamperes per square centimeter.

10. A method of electroplating as in claim 3 wherein said additive comprises at least one chemical species that suppresses electroplating when adsorbed on said surface.

11. A method of electroplating a void free copper layer onto a surface comprising a field region and a plurality of recessed features, the recessed features having a range of aspect ratios, the surface having a metal seed layer, the method comprising: immersing said surface into an electroplating solution comprising copper ions, a suppressing additive, and an accelerating additive under conditions wherein an initial dc cathodic current density of from about 0.1 to about 5 milliamperes per square centimeter is applied to said surface to prevent dissolution of the seed layer; maintaining said initial dc cathodic current density through said surface to create a substantially conformal conductive copper film having a thickness of about 500 Angstroms or less on said surface; increasing said current density from said initial value to a second value wherein suppressing additives are preferentially depleted at the bottoms of recessed features having the highest aspect ratios such that electroplating deposition occurs preferentially on said bottoms, and maintaining the current density at said second value until said recessed features are filled to the extent that the aspect ratios of all of said recessed features are less than approximately 0.5; and further increasing said current density to a third value providing a condition of rapid conformal plating, completely filling said recessed features and depositing a copper layer on said filled recessed features and said field region.

12. The method of claim 11 wherein said second value of current density is from about 4 to about 45 milliamperes per centimeter squared and said third value of current density is from about 15 to about 75 milliamperes per centimeter squared.

13. The method of claim 11 wherein said metal seed layer is a metal seed layer formed by a physical vapor deposition process.

14. The method of claim 11 wherein the range of aspect ratios is from about 0.02 to about 5.5.

* * * * *

UNITED STATES PATENT AND TRADEMARK OFFICE
CERTIFICATE OF CORRECTION

PATENT NO. : 6,946,065 B1
DATED : September 20, 2005
INVENTOR(S) : Mayer et al.

It is certified that error appears in the above-identified patent and that said Letters Patent is hereby corrected as shown below:

Title page, Item [54] and Column 1, lines 1-3,
Title, should read -- PROCESS FOR ELECTROPLATING METALS INTO MICROSCOPIC RECESSED FEATURES --.

Column 21,
Line 58, change "in pall" to -- in part --.

Signed and Sealed this

Seventh Day of February, 2006

JON W. DUDAS
*Director of the United States Patent and Trademark Office*